(12) United States Patent
Johnson et al.

(10) Patent No.: US 7,825,327 B2
(45) Date of Patent: Nov. 2, 2010

(54) CONCENTRATING SOLAR COLLECTOR

(75) Inventors: Eric C. Johnson, Mountain View, CA (US); Michael Leeds, San Francisco, CA (US)

(73) Assignee: Skyline Solar, Inc., Mountain View, CA (US)

( * ) Notice: Subject to any disclaimer, the term of this patent is extended or adjusted under 35 U.S.C. 154(b) by 212 days.

(21) Appl. No.: 12/124,124

(22) Filed: May 20, 2008

(65) Prior Publication Data

US 2009/0056787 A1    Mar. 5, 2009

Related U.S. Application Data

(60) Provisional application No. 61/043,704, filed on Apr. 9, 2008, provisional application No. 60/970,007, filed on Sep. 5, 2007.

(51) Int. Cl.
*H01L 25/00* (2006.01)
*H01L 31/042* (2006.01)
*H02N 6/00* (2006.01)

(52) U.S. Cl. ........................... 136/246; 136/243
(58) Field of Classification Search ........................ None
See application file for complete search history.

(56) References Cited

U.S. PATENT DOCUMENTS

| | | | |
|---|---|---|---|
| 1,830,375 A | | 11/1931 | Shoop |
| 3,760,624 A | | 9/1973 | Robinson |
| 4,056,404 A | * | 11/1977 | Garone et al. ............... 136/255 |
| 4,243,019 A | | 1/1981 | Severson |
| 4,337,758 A | | 7/1982 | Meinel et al. |
| 4,571,812 A | | 2/1986 | Gee |
| 4,583,520 A | | 4/1986 | Dietrich et al. |
| 4,611,575 A | | 9/1986 | Powell |
| 5,038,858 A | | 8/1991 | Jordan et al. |
| 5,058,565 A | | 10/1991 | Gee et al. |
| 5,288,337 A | | 2/1994 | Mitchell |
| 5,538,563 A | * | 7/1996 | Finkl .......................... 136/246 |
| 5,722,145 A | | 3/1998 | Haushalter et al. |
| 5,771,966 A | | 6/1998 | Jacoby |
| 5,961,739 A | | 10/1999 | Osborne |

(Continued)

FOREIGN PATENT DOCUMENTS

DE    20314372    1/2004

(Continued)

OTHER PUBLICATIONS

International Search Report dated Apr. 16, 2009 in PCT Application No. PCT/US2008/075250.

(Continued)

*Primary Examiner*—Alexa D Neckel
*Assistant Examiner*—Shannon Gardner
(74) *Attorney, Agent, or Firm*—Beyer Law Group LLP

(57) ABSTRACT

A solar energy collector is provided having at least one reflector panel, a plurality of solar receivers, and a support structure that supports the at least one reflector panels in a manner that defines a reflector troughs having a trough base, a pair of reflective side walls and a trough aperture suitable for receiving incident sunlight during operation of the collector, wherein each reflective side wall has a curvature that approximates a quarter parabola segment to thereby concentrate incident solar radiation on the plurality of solar receivers.

17 Claims, 16 Drawing Sheets

U.S. PATENT DOCUMENTS

| | | | |
|---|---|---|---|
| 6,020,554 | A | 2/2000 | Kaminar et al. |
| 6,260,610 | B1 | 7/2001 | Biber et al. |
| 6,276,359 | B1 | 8/2001 | Frazier |
| 6,399,874 | B1 | 6/2002 | Olah |
| 6,401,807 | B1 | 6/2002 | Wyler et al. |
| 6,508,301 | B2 | 1/2003 | Marsala |
| 6,615,909 | B2 | 9/2003 | Fast |
| 6,861,293 | B2 | 3/2005 | Soule |
| 6,870,087 | B1 | 3/2005 | Gallagher |
| 6,978,827 | B2 | 12/2005 | Armstrong |
| 6,994,082 | B2 | 2/2006 | Hochberg et al. |
| 7,065,873 | B2 | 6/2006 | Kang et al. |
| 2006/0225730 | A1 | 10/2006 | Anderson |
| 2006/0266407 | A1 | 11/2006 | Lichy et al. |
| 2007/0089777 | A1 | 4/2007 | Johnson et al. |
| 2007/0144578 | A1 | 6/2007 | Cunningham et al. |
| 2007/0272295 | A1 | 11/2007 | Rubin et al. |
| 2008/0134497 | A1 | 6/2008 | Corrales et al. |
| 2008/0135085 | A1 | 6/2008 | Corrales et al. |
| 2008/0135086 | A1 | 6/2008 | Corrales |
| 2008/0142319 | A1 | 6/2008 | Manter |

FOREIGN PATENT DOCUMENTS

| | | |
|---|---|---|
| JP | 53-131781 | 11/1978 |
| WO | WO 01/63665 | 8/2001 |
| WO | 03/098705 | 11/2003 |
| WO | 2004/114419 | 12/2004 |
| WO | 2005/006435 | 1/2005 |
| WO | 2006/083742 | 8/2006 |
| WO | 2008/013976 | 1/2008 |

OTHER PUBLICATIONS

Written Opinion dated Apr. 16, 2009 in PCT Application No. PCT/US2008/075250.
International Search Report in PCT Application No. PCT/US2008/075247 dated Nov. 30, 2009.
Written Opinion in PCT Application No. PCT/US2008/075247 dated Nov. 30, 2009.
International Preliminary Report on Patentability in PCT Application No. PCT/US2008/075250 dated Dec. 7, 2009.
International Preliminary Report on Patentability in PCT Application No. PCT/US2008/075247 dated Jan. 21, 2010.
Invitation to Pay Additional Fees in PCT Application No. PCT/US2008/075250 dated Feb. 10, 2009.
Alarte et al. "Design, Construction and Measurement of a Single-Mirror Two-Stage (SMTS) Photovoltaic Concentrator." 2$^{nd}$ World Conference and Exhibition on Photovoltaic Solar Energy Conversion, Vienna, Austria, Jul. 6-10, 1998.
Database WPI Week 200735, Thomson Scientific, London, GB; AN 2007-370318, XP002512878 & RU 2300058C2 abstract.
Whitefield et al. "The Development and Testing of Small Concetrating PV Systems." Solar Energy, Pergamon Press. Oxford, GB, vol. 67, No. 1-3, pp. 23-34, Jul. 1, 1999.
Partial International Search Report dated Feb. 11, 2009 in PCT Application No. PCT/US2008/075247.
Robinson Fin website: http://www.robfin.com/portals/0/R600006%20ruffled%20Model%20(1) downloaded on Apr. 17, 2009.
Mohedano et al., "Design, Construction and Measurement of a Dielectric-Single Mirror Two Stage (DSMTS) Photovoltaic Concentrator," *Proc. of the SPIE*, 4446, 2002, pp. 20-31.
Mohedano et al., "Design of a Simple Structure for the D-SMTS Concentrator," 16th European Photovoltaic Solar Energy Conference, Glasgow, UK 2000, pp. 2563-2566.
Sala et al., "480 kWpeak EUCLIDES™ Concentrator Power Plant Using Parabolic Troughs," Springer Berlin / Heidelberg, ISSN 0342-4111, 2007 (6 pages).
Sala et al., "The 480 kWp EUCLIDES™-Thermie Power Plant: Installation, Set-Up and First Results," (6 pages).
Smeltink et al., "40kW PV Thermal Roof Mounted Concentrator System," Energy Conversion, Conference Record of the 2006 IEEE 4th World Conference on vol. 1, May 2006 (4 pages).
Smeltink et al., "The ANU 20kW PV/Trough Concentration," Conference paper, 1999 (4 pages).
Wenham et al., "Applied Photovoltaics" Second Edition, Earthscan, ISBN-10:1-84407-401-3, 2007 (7 pages).
Winston et al., "Nonimaging Optics," Elsevier Academic Press, ISBN-13:978-0-12-759751-5, 2005 (10 pages).
"Harmony 11.5 kW Solar Cogeneration," HelioDynamics, Product datasheet (2 pages).
"Industrial Solar Engery," Menova Energy Inc., 2006 (5 pages).
"Continuing Testing Materials and Concepts," Solar20, www.solar20.com/SE/EN/1210-EN_prototype2.php, 2003 (1 page).
"Solar Power for a Sustainable World," Abengoa Solar IST, www.solucar.es/sotes/solar/en/tec_ccp.jsp, printed from online Apr. 15, 2008 (4 pages).
U.S. Appl. No. 12/100,726, filed Apr. 10, 2008.
U.S. Appl. No. 12/124,118, filed May 20, 2008.
U.S. Appl. No. 12/124,121, filed May 20, 2008.
U.S. Appl. No. 29/324,036, filed Sep. 4, 2008.
Notice of Allowance dated Mar. 26, 2010 from U.S. Appl. No. 12/100,726.

* cited by examiner

CONCENTRATING SOLAR COLLECTOR

CROSS REFERENCE TO RELATED APPLICATIONS

This application claims priority to U.S. Provisional Application No. 61/043,704 filed on Apr. 9, 2008, entitled "Dual Trough Concentrating Solar Photovoltaic Module" and to U.S. Provisional Application No. 60/970,007 filed on Sep. 5, 2007, entitled "Dual Trough Concentrating Photovoltaic Module", both of which are incorporated by reference herein for all purposes.

FIELD OF THE INVENTION

The present disclosure relates generally to solar energy collecting systems, and more particularly to concentrating solar energy collecting systems.

BACKGROUND OF THE INVENTION

The highest cost components of a solar photovoltaic (PV) system are the solar cells that convert sunlight to electricity by the photoelectric effect. To use these cells more effectively, concentrating photovoltaic (CPV) systems focus sunlight from a larger aperture onto a smaller cell area. Although many CPV designs have been developed from the very beginning of the commercial PV industry in the 1960's, not one has achieved significant commercial success as of late 2007. Although CPV designs use less active cell material, they typically require additional structure such as mirrors, lenses and heat sinks, and are fundamentally limited to utilizing less then all of the total available light. These factors increase cost and system complexity and reduce the optical-to-electrical efficiency over non-concentrating PV systems.

Although existing concentrating solar PV systems address some applications, there are continuing efforts to further improve the design and cost effectiveness of concentrating PV system.

SUMMARY

A solar energy collector is provided having at least one reflector panel, a plurality of solar receivers, and a support structure that supports the at least one reflector panels in a manner that defines a reflector troughs having a trough base, a pair of reflective side walls and a trough aperture suitable for receiving incident sunlight during operation of the collector, wherein each reflective side wall has a curvature that approximates a quarter parabola segment to thereby concentrate incident solar radiation on the plurality of solar receivers.

In another embodiment, a photovoltaic solar energy collector suitable for use in a solar energy collection system that tracks movements of the sun along at least one axis having an aperture, at least one reflector panel, and at least one solar receiver, each solar receiver including a plurality of photovoltaic cells having cell faces that are oriented substantially perpendicular to the collector aperture.

In yet another embodiment, a photovoltaic solar energy collector suitable for use in a solar energy collection system that tracks movements of the sun along at least one axis can have a trough style reflector arrangement a trough base, a pair of reflective side walls, a longitudinal axis, a trough aperture suitable for receiving incident sunlight during operation of the solar energy collection system, the trough aperture having an aperture axis that is substantially perpendicular to the longitudinal axis, and a plurality of solar receivers, each solar receiver being positioned generally adjacent and above an associated side wall such that the solar receivers do not shade the reflective side walls during operation in a mode the tracks movement of the sun along one axis. Each solar receiver has a base plate, and at least one photovoltaic cell carried on a front surface of the base plate.

A method for using a solar concentrating collector may comprise assembling one or more solar concentrating collectors, each solar concentrating collector having at least one photovoltaic cell, and tracking the one or more solar concentrating collectors, wherein a face normal of the photovoltaic cell is perpendicular to the incident sunlight.

These and other features will be presented in more detail in the following detailed description of the invention and the associated figures.

BRIEF DESCRIPTION OF THE DRAWINGS

The accompanying drawings, which are incorporated into and constitute a part of this specification, illustrate one or more example embodiments and, together with the description of example embodiments, serve to explain the principles and implementations.

In the drawings.

DESCRIPTION OF EXAMPLE EMBODIMENTS

Embodiments are described herein in the context of a dual trough concentrating solar photovoltaic module. The following detailed description is illustrative only and is not intended to be in any way limiting. Other embodiments will readily suggest themselves to such skilled persons having the benefit of this disclosure. Reference will now be made in detail to implementations as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
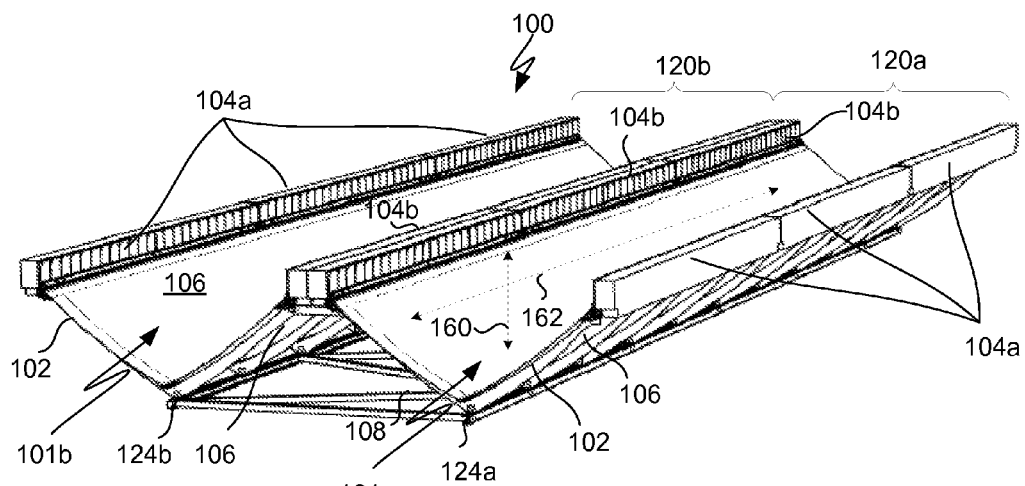
FIGS. 1A-1F illustrate an exemplary dual trough concentrating photovoltaic solar energy collector in accordance with one embodiment of the present invention.
Figure 1B:
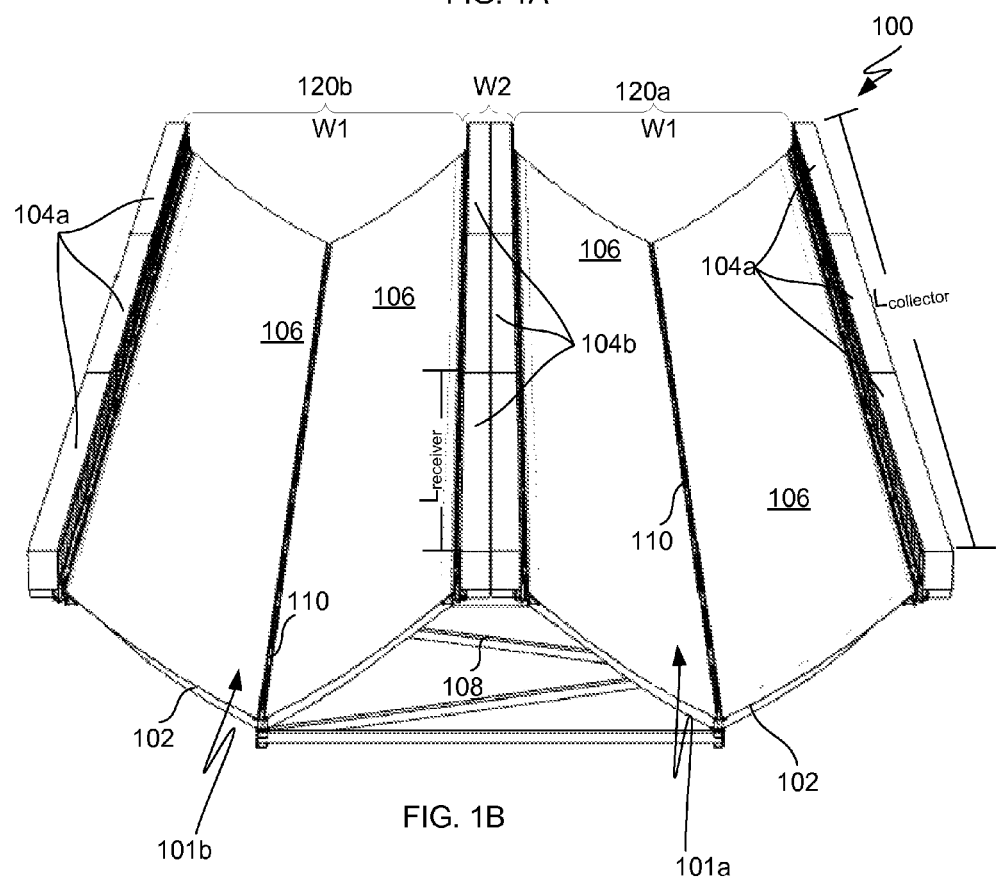
Figure 1C:
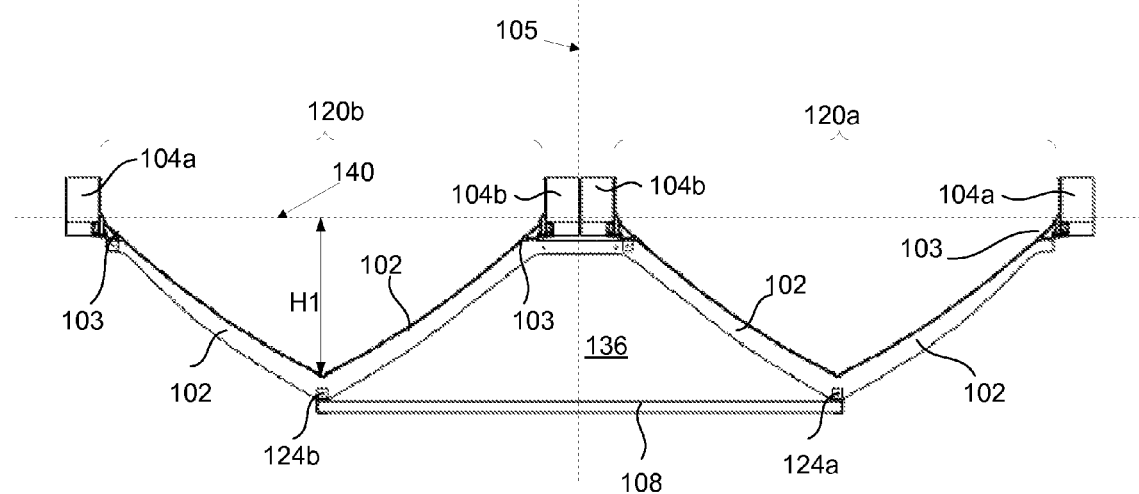
Figure 1D:
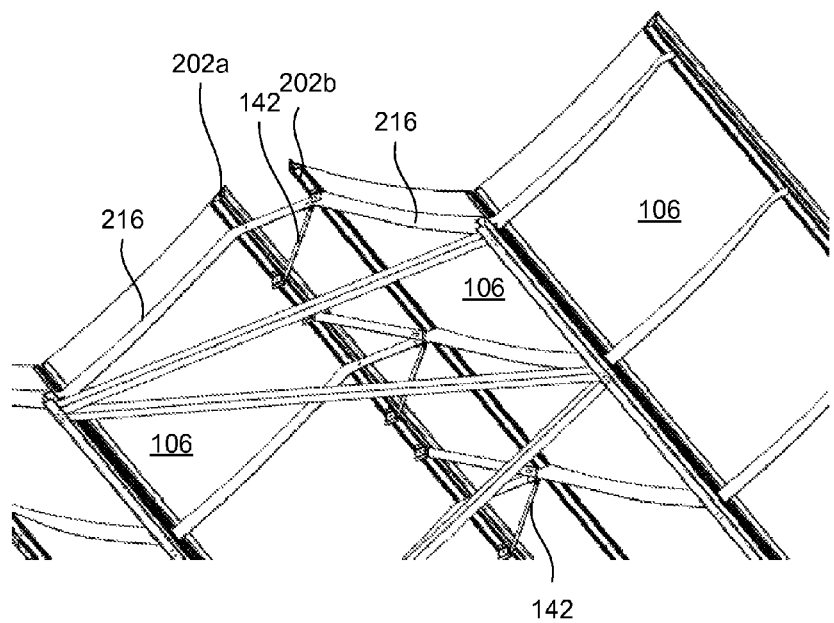
Figure 2A:
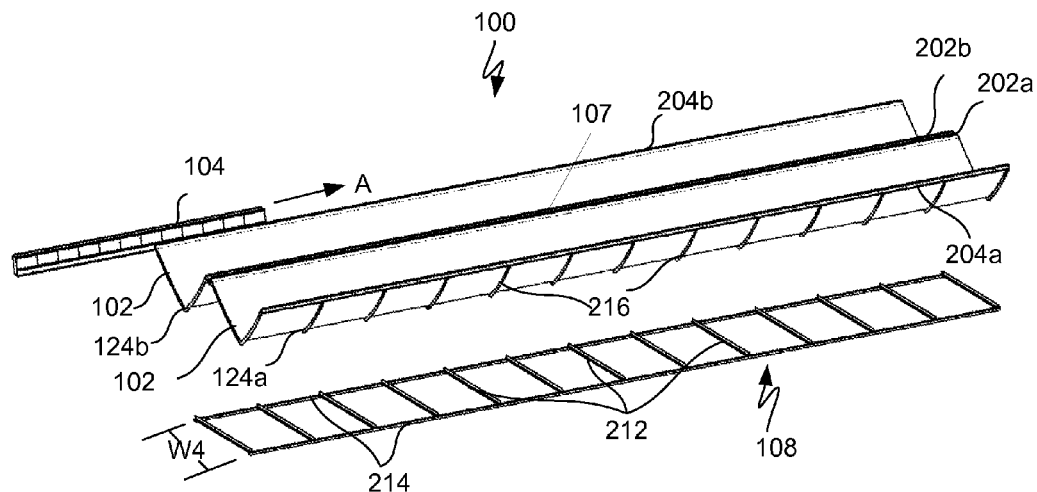
FIGS. 2A and 2B illustrate an expanded perspective view of the exemplary solar energy collector.

A solar energy collection system is described. FIGS. 1A-1C illustrate an exemplary dual trough solar energy concentrator or collector suitable for use with various embodiments of the present invention. FIG. 1A is a perspective view of the dual trough solar energy collector, FIG. 1B is a top perspective view of the dual trough solar energy collector, FIG. 1C is a side view of the dual trough solar energy collector, and FIG. 1D is a bottom view of the dual trough solar energy collector. The collector 100 has a dual trough design with two optical apertures 101a and 101b symmetrically situated about a bisecting plane 105 (FIG. 1C). The optical apertures 101 admit incident sunlight onto reflector panels 106. The support structure 102 is arranged to support at least four reflector panels 106. Reflector panels 106 are attached to the support structure 102 forming a reflector structure 107 (FIG. 2A). The reflector structure 107 may have a pair of adjacent reflector troughs 120a, 120b, each trough having a base 124a, 124b, and a pair of reflective side walls formed from the reflector panels 106. Reflector structure 107 may be configured so as to direct incident sunlight entering collector 100 through the optical apertures 101 toward a region slightly above a top edge of the opposing reflector panel 106. The support structure 102 is composed of a plurality of shaping ribs 216 (FIG. 2A) and other components as further described in detail below. The collector 100 also has a plurality of receivers or solar receivers 104 coupled near the top edges of the reflector structure 107 as further described in detail below.

Figure 1E:
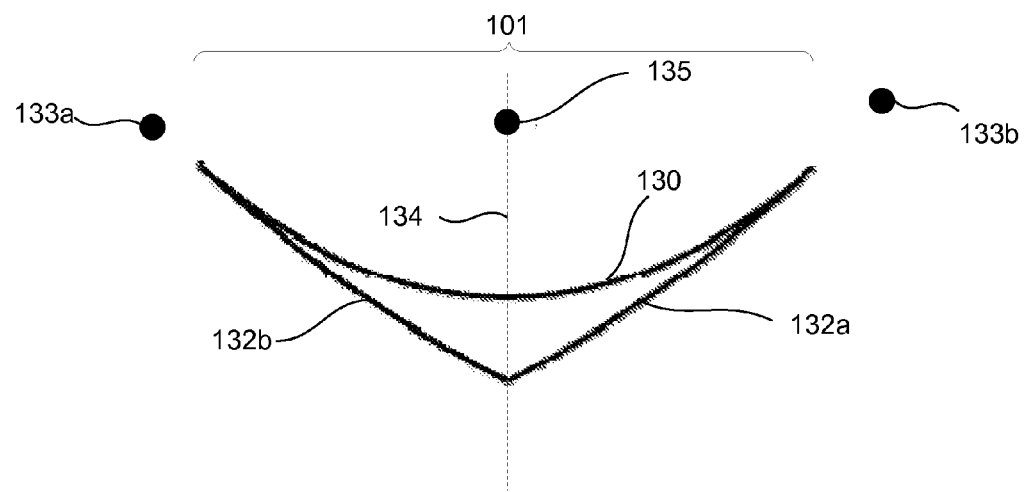
Figure 1F:
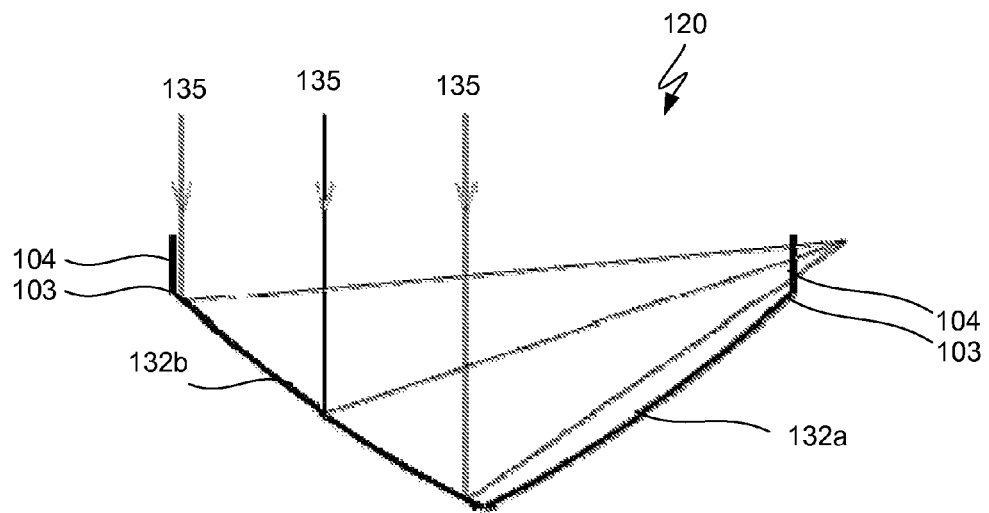

FIGS. 1E and 1F illustrate a cross-sectional diagram of the troughs. Each collector 100 has a longitudinal axis 162 (FIG. 1A) and each trough 120a, 120b has an optical aperture 101 (FIG. 1E). For the purposes of this explanation, we utilize the term aperture to refer to the effective trough opening that exists when the collector is directly facing the sun. We also use the term normal axis 160 (or aperture axis or lateral axis as illustrated in FIG. 1A) to refer to a geometric axis that is perpendicular to the longitudinal axis and parallel to incident solar radiation when the collector is facing directly towards the sun. If the trough is symmetrical, the trough may also have a trough bisecting plane 134 dividing the trough into two substantially symmetric halves, each substantially symmetric half resembling a longitudinally extended curved section. In other embodiments, the trough halves may be asymmetrical. The reflectors that define the troughs are curved to direct sunlight towards an associated solar receiver. The curvature of the troughs can vary somewhat. In one embodiment, each substantially symmetric half has a curvature resembling that of a quarter section of a parabola 132. In other words, the curvature of the troughs may approximate an arc of a circle or any other geometries that provide suitable concentration of the sunlight at the targeted receivers. In the quarter section embodiment, each trough 120a, 120b may be composed of two quarter section of a "full" or traditional parabola having the same focus. Although described as a quarter section of a parabola this description is not intended to be limiting as the troughs 120 are approximately similar to a quarter section of a parabola shape and not an exactly mathematically perfect parabola shape.

FIG. 1E illustrates a traditional center-focusing full parabola configuration 130, with a focus at 135, superimposed and compared to the use of two quarter sections of a parabola 132. As compared to the full parabola configuration 130, use of a substantially quarter of a parabola 132 configuration provides for a deeper or V-shaped trough and each side of the trough has less curvature. A quarter section of a parabola 132 is a section of a parabola such that when two opposing quarter sections are positioned adjacent to each other the focus of one section is near the top edge of the opposing section. For example, the focus for section 132a is at 133a and the focus for section 132b is at 133b. The quarter parabolic trough 132 achieves the same geometric concentration as a full parabola concentrator, but has a lower curvature and may also be stiffer. The reduced curvature also reduces the stress in a bent reflector panel 106 and allows reflector panel 106 to be formed from a generally planar panel. The increased stiffness results from the shape having a higher area moment of inertia. Having a deeper trough and/or truss (as discussed below) also generally provides for a stiffer collector than a shallower one. Additionally, for a fixed axial load, a straighter beam may be stiffer than a curved beam. The increased intrinsic stiffness of this design allows collector 100 to be fabricated using lighter and less expensive materials such as aluminum, sheet metal, and the like.

Referring back to FIGS. 1A-1C, the support structure 102 may support or hold a plurality of reflector panels 106. The reflector panels 106 may be shaped by elastic deformation against shaping ribs 216 (FIGS. 2A and 2B) of the support structure 102. In one embodiment, the reflector panels 106 may be plastically formed with a curvature. Thus, the reflector panels 106 may be supported and held by the structure 102 with a curvature resembling a quarter parabolic configuration, as further discussed in detail below with reference to FIGS. 2A and 2B.

Although a single quarter parabolic trough provides higher bending stiffness than the equivalent full parabolic trough, it is an open shape and may thus have low torsional stiffness. Torsional stiffness is desirable because the solar energy collector is rotated during the day to align to the sun. To provide for additional torsional stiffness, the illustrated collector 100 has a stiffening frame 108 coupled to bottoms 124a and 124b of the shaping ribs 216 or support frame 102. This forms a closed truss 136, as illustrated in FIG. 1C, in a region between the troughs 120a, 120b below the reflector panels 106. The closed collector support truss 136 framework forms a trapezoidal-shaped torque tube. Although described as a trapezoidal shape, the truss 136 is approximately similar to a trapezoidal shape and not an exactly mathematically perfect trapezoidal shape. Given the large apertures 101 and the light weight of the collector 100, the trapezoidal torque tube provides for a stiff structure.

As illustrated in FIG. 1F, the quarter parabola trough configuration or shape is configured to direct the focus of the troughs 120 to a location just above the far edge of the opposing trough segment. This allows the solar receivers 104 to be located where they will not shade the reflector panels 106. Additionally, the solar receivers 104 may be attached to the trough 120 edges 103 without the use of struts that extend over the faces of the reflector panels. Traditionally, a closed shaped truss is created by installing struts over the trough opening. The struts cast shadows over the reflector panels, which results in a less efficient photovoltaic design. As described above, use of the quarter parabola trough configuration of FIG. 1F permits the use of the closed shaped truss under the reflector structure 107 and under the reflector panels 106. Furthermore, the quarter parabola trough configuration allows for the solar receivers 104 to be located at the edges of the reflector structure 107, as further described below with reference to FIG. 2A. The solar receivers 104 and all structural elements such as the stand, support structure and frame thus do not cast a shadow over the reflector panels 106, which results in a more efficient solar energy collector 100.

Referring back to FIGS. 1B-1D, the dimensions of the collector units 100 may be widely varied to meet the needs of particular applications. By way of example, collector lengths $L_{collector}$ on the order of between about 5-6 meters (m) having at least three solar receivers 104 mounted near each top edge of the support structures 102a, 102b work well for many applications. In such systems optical aperture widths (W1) in the range of about 800-1200 millimeters (mm) with an optical aperture 101a, 101b separation (W2) of between about 15-250 mm work well. Thus, the total width of the collector may be between 2-3 m. The height (H1) of each trough from bottom 124 to top edges 103 of the support structure 102 may be between about 300-400 mm. The top edges 103 may also lie in a longitudinal plane 140 of the collector. In one specific example, $L_{collector}$ may be 5.7 m, W1 may be 1010 mm, W2 may be 200 mm, the total width of the reflector structure 107 may be 2.25 m, H1 may be 360 mm, and the outer receiver support rails 204 (FIG. 2A) may have a width of 15 mm. To achieve the approximate quarter parabola curvature a generally planar panel may be elastically deformed to deviate from planarity from between about 10 to 40 mm. Although some specific dimensions are mentioned herein, it should be appreciated that the dimension of the collectors are in no way limited to these ranges. Rather, they can be widely varied to meet the needs of a particular application.

As illustrated in FIG. 1D, a plurality of braces 142 may be used to attach the shaping ribs 216 to the receiver support rails 202 on the support structure 102. The braces 142 may provide for additional support and strength to the collector 100 as further discussed below.

Figure 2B:
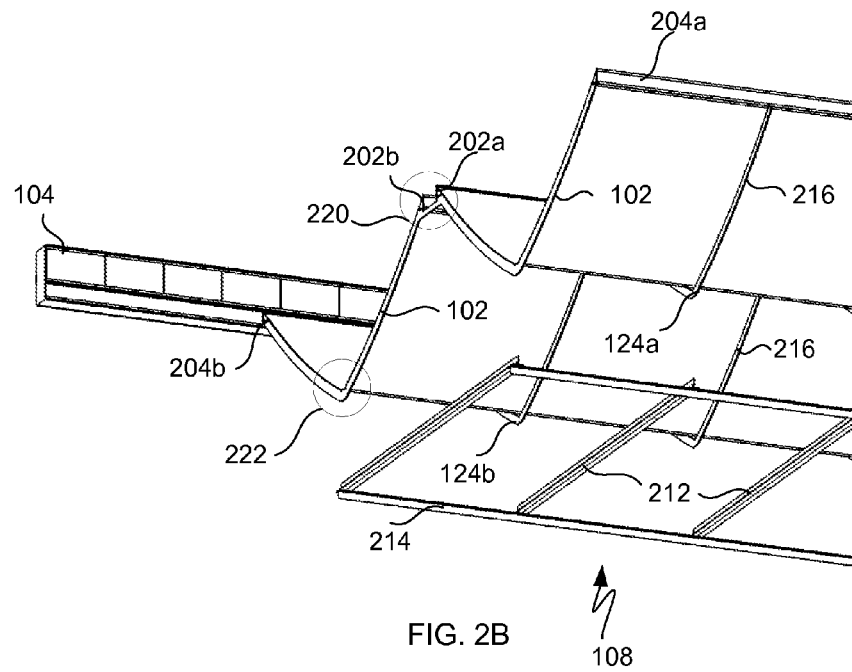

FIGS. 2A and 2B illustrate an expanded perspective view of the exemplary solar energy collector. As seen therein, the reflector structure 107 has a plurality of shaping ribs 216. The shaping ribs 216 may provide both the correct optical shape and the structural stiffness for the reflector panels 106. The surface of the shaping ribs 216 adjacent to reflector panels 106 is formed to resemble the quarter parabolic configuration or shape. The shaping ribs 216 may approximately resemble a quarter parabolic shape to achieve an adequate focus of sunlight on solar receivers 104. For example, in one embodiment the surface of the shaping ribs 216 adjacent to reflector panels 106 may be formed to approximate an arc of a circle or other shape that provides suitable concentration at the receiver. Although the shaping ribs 216 are illustrated below the edge of the reflector panels 106, the location or positioning of the shaping ribs 216 is not meant to be limiting as the shaping ribs 216 may be located at any longitudinal position to support the reflector panels 106.

The shaping ribs 216 may be formed as a single dual trough structure from a sheet stock by water jet cutting, laser cutting, stamping, or any other suitable means. The sheet stock may be of any form. For example, the sheet stock may be a planar, rectangular sheet stock. In another example, the sheet stock may be formed into a "T" shape, "D" shape, "L" shape, "C" shape, or any other similar shape that provides for a higher stiffness and stronger shaping rib. In another embodiment, shaping ribs 216 may be assembled from multiple pieces and coupled together via any means such as the use of structural adhesives, welding, bolts, and the like. Furthermore, the shape of the shaping ribs 216 may minimize scrap during production as most of the material in a rectangular piece of sheet stock is used to form the shaping ribs 216.

The actual geometry of the shaping ribs may be widely varied. In some particular embodiments suitable for use with collectors sized as described above, each shaping rib 216 may have a height (H2) of between about 20-120 mm and a thickness of 1 to 4 mm. In one example, the shaping rib 216 may be 40 mm in height, H2, and have a thickness of 1.5 mm. In some embodiments, the shaping rib 216 may be thicker at the bottoms 124 and thinner near the top edges 103. Alternatively, shaping rib 216 may be a composite structure formed from multiple pieces of sheet metal stock bonded together with any known means such as the use of structural adhesives, structural tape, welding, bolts, and the like. This may minimize weight and maximize strength of each rib 216 and the collector 100.

The quarter parabolic configuration of the shaping ribs 216 allows for the shaping ribs 216 to be made from lighter, lower-cost structural material. Additionally, in one assembly procedure, flat reflector sheets are bent to conform to the quarter parabolic configuration of the shaping ribs 216. As described above, one advantage of the quarter parabolic configuration is that it does not generate large stresses within the reflector when the reflector sheets are bent during assembly to form the reflector panels 106. Furthermore, the support structure 102 allows a single reflector panel 106 to be fabricated from a single, continuous reflector sheet for each half trough that extends along the entire length $L_{collector}$ of the collector 100. Of course it should be appreciated that in alternative embodiments, each half trough can be formed from multiple reflector panels arranged side-to-side, end-to-end or in any configuration that completely covers the half trough.

In one embodiment, each reflector panel 106 may be made of Miro-Sun® KKSP, made by Alanod of Ennepatal, Germany. The Miro-Sun® KKSP is a 0.5 mm thick aluminum strip that may have a specialty surface providing over 90% specular reflection over the band in which silicon photovoltaic cells operate. A protective lacquer coating may be applied to the top of the reflector panels 106 to increase abrasion and weather resistance. In another embodiment, the reflector panels 106 may be made of any high reflection material, produced by Alanod or a plurality of other vendors. In still another embodiment, the reflector panel 106 may have a silver coated polymer-based laminate over the aluminum strip. Once the reflective properties of the silver coated laminate are degraded from weather and/or the sunlight, the silver coated laminate may be removed to thereby expose a new reflective layer. This allows the collector 100 to be used for longer periods of time without having to be replaced, easily maintained, and less costly. A reflector panel may have between about 1-5 layers of silver coated laminate.

The reflector panels 106 may be made in a continuous roll-to-roll process having a width of 1250 mm. Each reflector panel 106 may be formed by using an entire roll width, or one-half or one-third of the width of the roll thereby reducing any waste as the entire roll may be used to form the reflector panels. In one example, the reflector panels 106 may be a half-width slit roll having a width of 625 mm, which forms a reflector panel having a length substantially equal to $L_{collector}$ and a height substantially equal to H1. In another example, the length may be 5.7 m and the height may be 360 mm. In one embodiment, each reflector panel may be formed from a plurality of reflector sheets, each sheet being fabricated from a roll of reflector material in such a way to substantially utilize all the reflector material on the roll with minimal waste.

In another embodiment, the reflector panels 106 may be made of a tempered thin glass mirror bonded to a suitable backing. The mirror may have a thickness of between about 0.10 mm to 1 mm. The quarter parabolic configuration curvature of the reflector panels 106, when elastically deformed to conform on the support structure 102, is less than the curvature of a traditional full parabola configuration allowing use of the tempered thin glass mirror. In one embodiment, the reflector panels 106 may have a silver coated laminate over the mirror as discussed above.

In yet another embodiment, the reflector panel 106 may have a backing panel attached to the reflective surface (not shown) to stiffen the panel assembly. In one example, the backing panel may be a sheet of aluminum or similar material. In another example, the backing panel may have a complex structure, such as a honeycomb, X-shape, V-shape, or the like. The backing panel may have a thickness of between about 0.5 mm to 5 mm.

In yet still another embodiment, the reflector panels 106, support structure 102, and frame 108 may all be made of the same material, such as aluminum. Use of the same material may ensure a similar coefficient of thermal expansion (CTE) that allows for the use of large area reflector panels without deleterious mechanical deformation. As illustrated and described above with reference to FIG. 1B, each collector 100 may have four reflector panels 106 that each run the full length $L_{collector}$ of the collector 100. This provides for easier assembly of the collector 100 and for a stiffer overall structure compared to current solar energy collectors. Current collectors must install shorter reflector panels or strips to accommodate for the CTE mismatch between the frame and the reflector because the CTE mismatch may cause deformation and potential permanent mechanical damage as discussed above.

As described above and below in detail, in some existing designs, strips of the reflector panels may cast a shadow on the solar cells. Any shadow on the solar cell may reduce the overall concentrator efficiency disproportionately due to the nature of the electrical connection among the solar cells as the solar cells may be connected electrically in series. The efficiency may decrease by the ratio of shadow width to cell width and not by the ratio of shadow width to aperture length. For example, a 5 mm wide gap or non-reflective section between the strips of reflectors may cast a shadow at least 5 mm wide on a cell 78 mm wide, leading to an overall efficiency decrease of 5/78 or 6.4%.

In the illustrated embodiment, the frame 108 has a plurality of cross beams 212 and at least a pair of parallel support bars 214. The parallel support bars 214 may be elongated, longitudinal structures formed from an extrusion. In another embodiment, the parallel support bars 214 may have a plurality of elements, such as additional parallel support bars, coupled together such as with the use of structural adhesives, welding, soldering, brazing, and the like to form the single parallel support bar for the frame 108. Alternatively, the parallel support bars 214 may be made stronger with other structural devices such as angled brackets, elongated rods positioned within the center of the parallel support bars 214, and the like. The cross beams 212 may be any member joining the support bars 214 to provide structural support and bracing between the support bars 214. The frame 108 may be coupled to the bottoms 124a and 124b of the support structure 102 and shaping ribs 216 to provide structural support for the collector 100. In one embodiment, the cross beams 212 are T-sections as illustrated in FIGS. 2A and 2B and may be substantially equal to the number of shaping ribs 216. The cross beams 212 may be formed from an extrusion. In another embodiment, the cross beams 212 may be positioned to form various geometric shapes, such as joining the support bars 214 at an angle thereby forming a triangle as illustrated in FIGS. 1A and 1B. Thus, the placement of the cross beams 212 is not meant to be limiting as the cross beams 212 may be placed in any position along the support bars 214 such as an X-shape, and the like.

The frame 108 may connect to the reflector structure 107 via the bottoms 124a, 124b to form the closed trapezoidal torque tube structure 136 as described above. In one embodiment, frame 108 may be coupled to the support structure 102 via opening 306 (FIG. 3C) with a bolt, screw, mating tabs and slots, or any other similar known means. Additional hardware, such as lugs, may be used to couple the frame 108 to the reflector structure 107 as further discussed below. In another embodiment, frame 108 may be coupled to the reflector structure 107 by being welded together, or by any other means. The frame 108 may have a length substantially equal to or slightly less than $L_{collector}$ and a width (W4) of between about 800-1400 mm. In one embodiment, W4 may be 1300 mm.

While the frame 108 shown in FIG. 2B is planar, this is not intended to be limiting as the frame may have a non-planar configuration. For example, the frame 108 may have a V-shape, which increases the effective diameter of the torque tube created when frame 108 is coupled to reflector structure 107. This increases the torsional stiffness of the collector 100.

As illustrated in FIG. 2A, the support structure 102 may have inner receiver support rails 202a, 202b and outer receiver support rails 204a, 204b. The inner receiver support rails 202a, 202b and outer receiver support rails 204a, 204b may be oriented perpendicular to the shaping ribs 216 and attached to the top ends of each support rib 216. Each receiver support rail 202, 204 may be configured to receive solar reflectors 104 as described in detail with reference to FIGS. 3A and 3B. In one example, each top rail 202, 204 may be configured to slideably receive a solar receiver 104 in a longitudinal direction as illustrated by arrow A. In another example, solar receivers 104 may be coupled to each top rail 202, 204 by any means that allows for differential thermal expansion between the solar receivers 104 and each top rail 202, 204. Solar receivers 102 may be coupled to reflector structure 107 in such a manner to allow removal or installation of a middle receiver without removal of adjacent receivers.

Figure 3B:
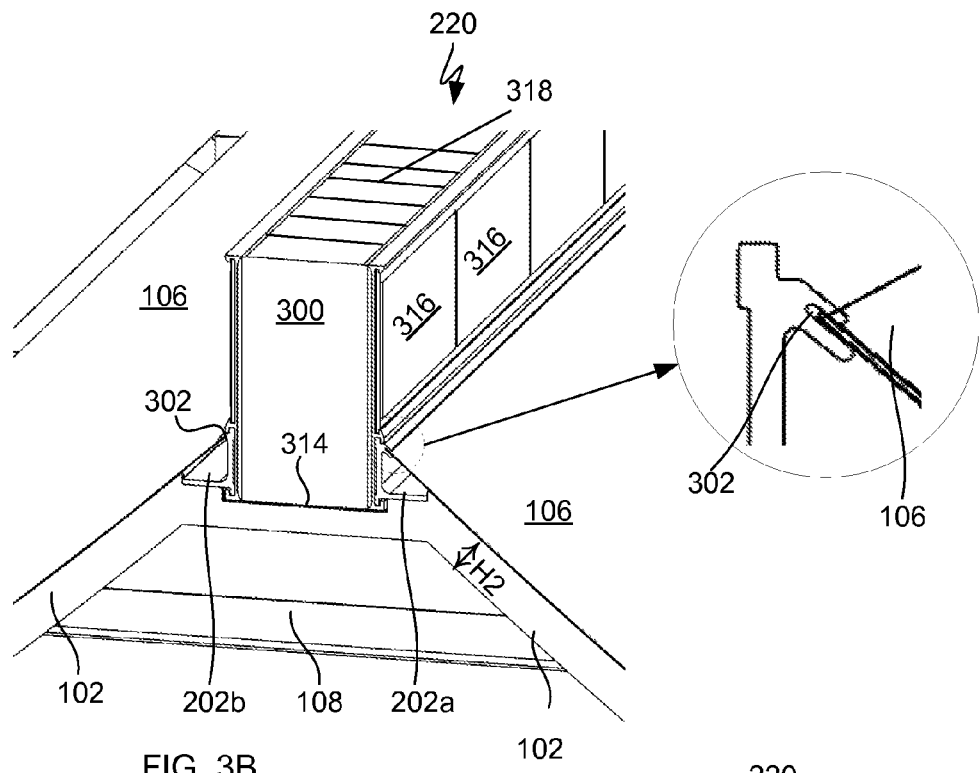
FIGS. 3A-3D illustrate detailed sections of the collector illustrated in FIG. 2B.
Figure 3A:
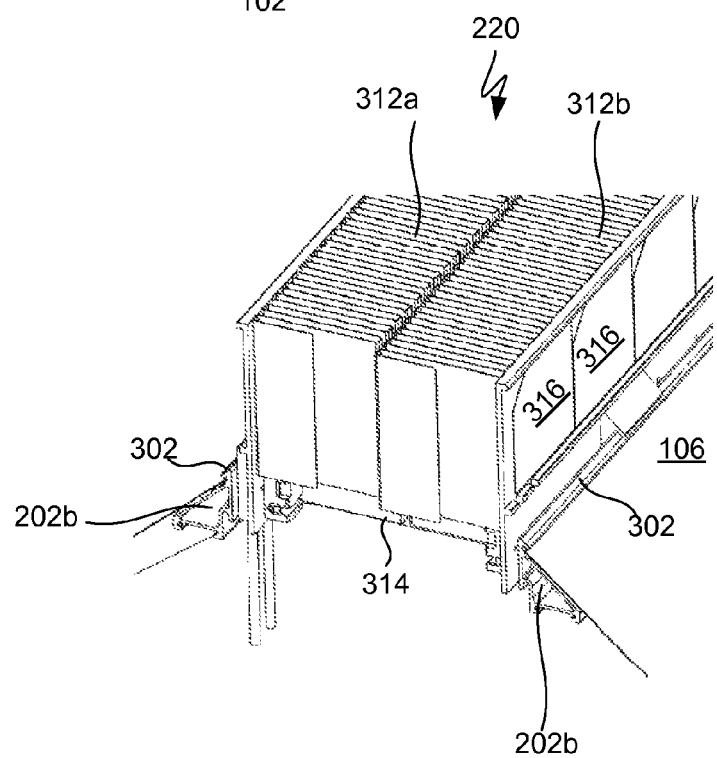

FIGS. 3A-3D illustrate detailed sections of the collector illustrated in FIG. 2B. FIGS. 3A and 3B illustrate a detailed view of section 220 of FIG. 2B. FIG. 3A illustrates a detailed view of 220 of FIG. 2B with exemplary solar receiver 312a, 312b as described with reference to FIG. 4D. FIG. 3B illustrates a detailed view of 220 of FIG. 2B with an exemplary dual sided receiver 300 as described with reference to FIGS. 4D. Dual sided receiver 300 may have a plurality of solar cells 316 on two opposing sides and a heat sink 318 located between the solar cells 316. FIGS. 3A and 3B illustrate the inner receiver support rails 202a, 202b of support structure 102. The upper edges of each reflector panel 106 may be received by an attachment member 302. The attachment member 302 may be formed in the top rail 202, 204 as part of support structure 102. The attachment member 302 may have a slit, groove, or any other type of receiver to receive and support the upper edge of the reflector panel 106.

The receiver support rails 202 may be coupled to the shaping ribs 216 and support structure 102 at a notch 314 formed between the troughs 120a, 120b. The receiver support rails 202 may be coupled to the shaping ribs 216 by any known means such as with the use of structural adhesives, welding, soldering, brazing, and the like. Additional hardware, such as lugs, brackets, braces (142 illustrated in FIG. 1D) and the like may be used to attach the shaping ribs 216 to the receiver support rails 202. Brace 142 may be used to provide addition stiffness for the connection between the shaping ribs 216 and the inner receiver support rails 202. Shaping ribs 216 are positioned along the length of collector 100 at regular intervals to provide mechanical support and define the optical shape of reflection panels 106. Typical rib-to-rib spacing may be between about 200 mm to 800 mm. In one embodiment, the rib-to-rib spacing is about 550 mm. The shaping ribs at the ends of the collector 100 may also be set back from the reflector panel 106 side edges to provide space for coupling structures and mounting posts, as defined in more detail below. The attachment member 302 may serve as a structural element, provide shape for the reflector panels 106 by constraining the upper edge of the reflector panels 106. The receiver support rails 202, 204 may serve to aid in the installation of the reflector panels 106, and provide a stress-free sliding interface for the solar receivers 300, 312 by allowing the solar receivers 300, 312 to be easily slideably received by the receiver support rails 202, 204.

Figure 3C:
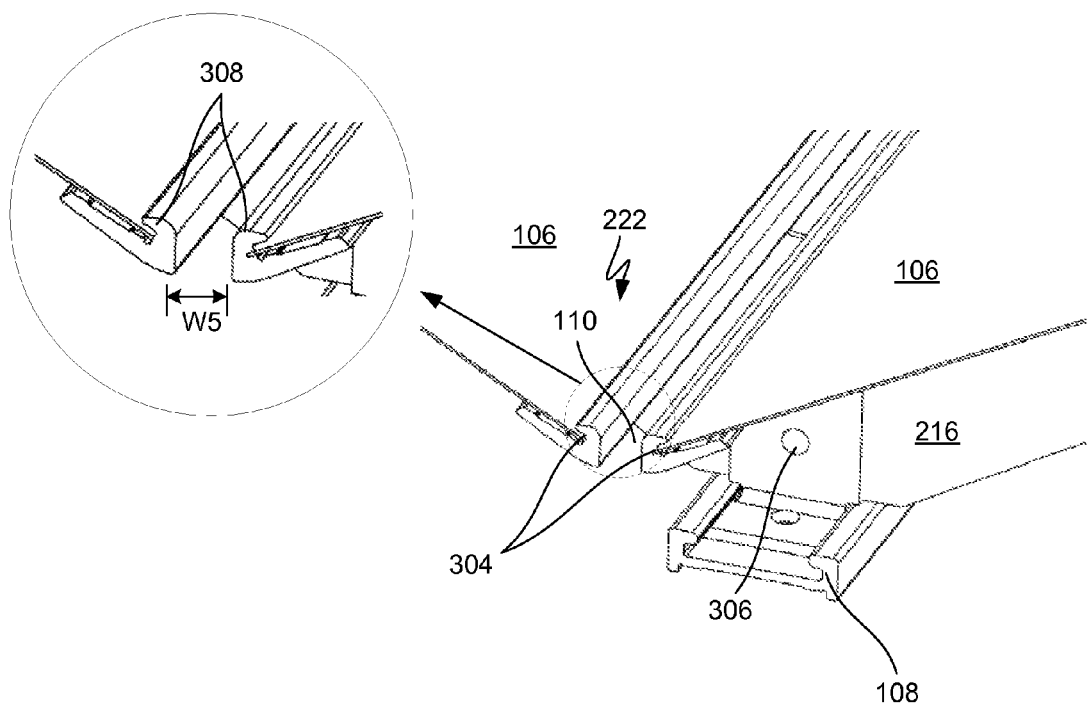

FIG. 3C illustrates a detailed view of section 222 of FIG. 2B. In the illustrated embodiment, each shaping rib 216 has a groove 304 to receive a bottom edge protector 308. The bottom edge protector 308 extends longitudinally substantially near the bottom 124 of the entire length of support structure 102. The bottom edge protector 308 may have a slit, grove, notch, or any other type of receiver to receive and support the bottom edge of the reflector panel 106. Reflector panel 106 may be press fit into the edge protector 308 or be attached to the edge protector 308 by any suitable means including use of structural adhesives, welding, or brazing, or similar means. As further illustrated in FIG. 3C, a drainage gap 110 may be formed between the lower edges of each reflection panel to allow any moisture or water to drain through the collector 100. The width (W5) of the drainage gap 110 may be between about 5-20 mm. In one embodiment, W5 may be about 10 mm.

In one embodiment, the reflector panels 106 may be affixed to the support structure 102 by any known means such as the use of structural adhesives, welding, soldering, brazing, bolts, screws, or the like. This allows for the reflector panels 106 to resist shear and the stiffness of the collector 100 increases. Unlike traditional full parabola collectors, the quarter parabolic configuration may be able to withstand higher shear loads before buckling due to its lower curvature. Additionally, for the same system design load, a wider spacing between each shaping rib 216 may be possible.

When reflector panels 106 are held and supported by support structure 102 between attachment member 302, bottom edge protector 308, and against shaping ribs 216, the reflector panels 106 are bent with a curvature having a substantially quarter parabolic configuration. This quarter parabolic configuration enables sunlight 135 to be directed towards the solar receiver 104 using a single reflection as illustrated in FIG. 1F. Use of only a single reflection improves the collector optical efficiency compared to multi-reflection systems. Current dual trough solar collectors typically require more than one reflection by the sunlight before being received by a solar receiver.

Figure 3D:
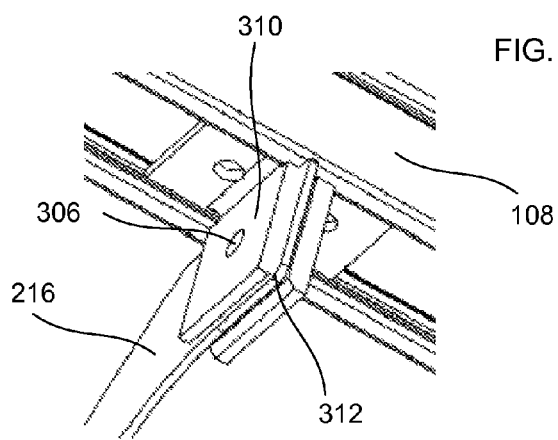

FIG. 3D illustrates an exemplary lug 310 that may be used to attach the shaping ribs 216 to the frame 108. Although illustrated attaching the shaping ribs 216 to the frame 108, the lug 310 may also be used to attach the shaping ribs 216 to the undersides of the receiver support rails 204 of the structural support 102. The lug 310 may be "T" shaped such that the lug 310 may be slideably received by the frame 108 as illustrated. Since the lug 310 may easily slide into the frame 108 and/or undersides of the receiver support rails 204, the use of the lugs 310 provides for easy assembly. The lug 310 may have a slit 312 to receive a shaping rib 216. In use, the lug 310 may have a plurality of openings 306 to match the openings (not shown) in the shaping rib 216 such that an attachment member, such as a screw, bolt, rod, or the like may be received by the openings 306 to secure the shaping rib 216 to the frame 108.

In one embodiment, the lug 310 is coupled to the frame 108 and/or undersides of the receiver support rails 204 via a structural adhesive. The structural adhesive may be injected into the joint through the openings 306 and may flow across the joint covering all mating surfaces. No trapped air spaces are present using this technique providing uniform coverage of the adhesive and a consistent repeatable adhesive bond thickness between the frame 108 and the underside of the lug 310. This provides for a strong bond attachment of the lug 310 to the frame 108.

FIGS. 4A-4E illustrate exemplary embodiments of a solar receiver. Each collector 100, as illustrated in FIG. 1A and 2A, may have outer solar receivers 104a positioned on the outer receiver support rails 204 of the collector 100 and inner solar receivers 104b positioned on the inner receiver support rails 202 of the collector 100. Each solar receiver 104 may have a length less than the length $L_{collector}$ of the collector 100. The solar receiver length is chosen so that an integral number of receivers, positioned longitudinally adjacent to each other with a minimal gap, have a length substantially equal to $L_{collector}$. For exemplary purposes only and not intended to be limiting, if $L_{collector}$ is about 5.7 m, and three receivers are used, the length of the solar receiver 104 may be about 1.897 m. Additionally, each solar receiver 104 may weigh between about 15-45 pounds (lbs) to allow for ease of assembly, maintenance, and removal. In one embodiment, the weight of each solar receiver may be about 30 lbs.

Figure 4A:
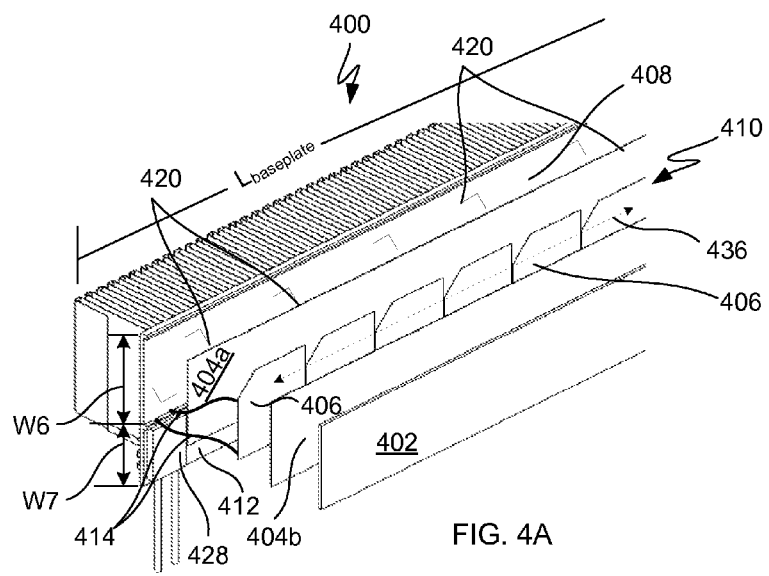
FIGS. 4A-4E illustrate exemplary embodiments of a solar receiver.
Figure 4B:
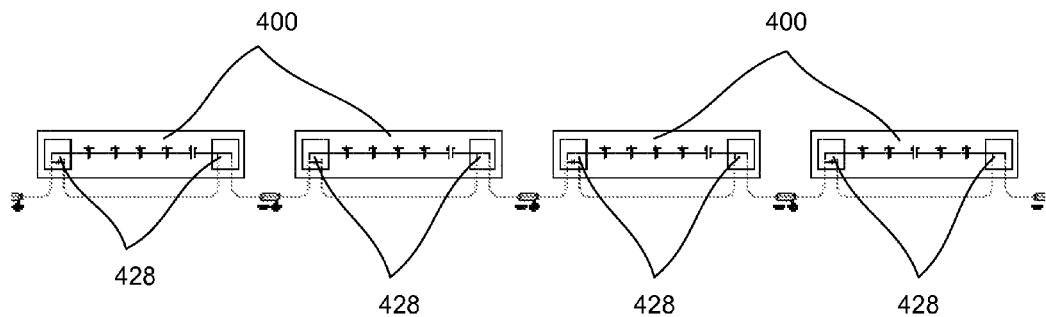

Referring to FIGS. 4A and 4B, an exploded view of the solar receiver, each solar receiver 104 may have a base plate 408, a first encapsulant layer 404a above the base plate, a plurality of PV or solar cells 406 above the first encapsulant layer 404a, a second encapsulant layer 404b above the plurality of solar cells 406, and a top protective sheet 402 above the second encapsulant layer 404b. The solar receiver 400 may be formed by any known process, such as lamination, and the like. Lamination is a process that consists of heating the solar receiver stack and applying pressure to fuse all the components together to form a laminate receiver structure. The lamination process may also occur in a vacuum environment to reduce air bubbles.

The base plate 408 may provide a backing for the plurality of solar cells 406 during lamination. The base plate 408 may be formed of an extruded metal, for example, aluminum, an extruded metal filled polymer, or any similar material. In one embodiment, the base plate 408 may be formed with mechanical features 420 extending outwardly from the base plate 408 to mechanically capture and position each of the solar cells 406. The base plate 408 may be wide enough to receive each of the plurality of solar cells 406. In one embodiment, the width of the base plate (W6) may be between about 80-85 mm. The base plate 408 may have a mating feature 412 to engage the rails 202, 204 as discussed in detailed below with reference to FIG. 8. The mating feature 412 may have a width (W7) of between about 15-50 mm. Alternatively, as shown in FIG. 4E, base plate 408 may have a plurality of clips 508 (FIG. 5) or other mechanical devices positioned below solar cells 406 to facilitate attachment of base plate 408 to rails 202 and 204. The length of the base plate 408, $L_{baseplate}$, may define the length of the solar receiver 400 and may be between about 1.0-6.0 m. In one embodiment, $L_{baseplate}$ may be about 1.897 m.

The base plate 408 may have a low mass such that it allows for a reduced lamination cycle time as compared to traditional solar receiver lamination processes. In some embodiments, the base plate 408 has a layer of a thin conformable dielectric coating applied to provide redundant electrical insulation. The dielectric coating may be any known polymer and may be applied as a liquid or powder. The dielectric coating may be applied to the base plate 408 by any known means such as baking, painting, and the like. The dielectric coating may be thin to maintain a high thermal conductivity and may be between about 20-100 microns.

The first and second encapsulant layers 404a, 404b provide electrical isolation between the plurality of solar cells 406 and the base plate 408 to prevent conduction from the base plate 408 and electrical shorting of the plurality of solar cells 406. The encapsulant layers 404 may also protect the plurality of solar cells 406 from weather and moisture. Additionally, the encapsulant layers 404 may compensate for any differential thermal expansion between the plurality of solar cells 406 and the base plate 408.

The encapsulant layers 404 may be made of thermo-polymer urethane (TPU), ethylene vinyl-polymer acetate (EVA), or any other similar materials. TPU is particularly well suited for use in solar applications because it is more resistant to ultra violet (UV) radiation than traditional EVA materials, which is particularly important in receivers utilized in conjunction with solar concentrators because the ultra violet radiation is concentrated as well. The encapsulant may be a poured or thermoplastic silicone that has a high light transmissibility and stability under more intense UV light.

The top protective sheet 402, although optional, may protect the plurality of solar cells 406 from moisture, air, contaminates, and the like. The top protective sheet 402 may be formed of any protective material such as glass, Teflon® (such as DuPont Teflon Tefzel®, a modified ethylene-tetrafluoroethylene fluoropolymer (ETFE)), or any other similar materials. An optional anti-reflection or spectrally selective coating can be applied to the outer and/or inner surface of top protective sheet 402 to improve collector efficiency. In one embodiment the, the top protective sheet 402 may be a thin, chemically-tempered glass having a thickness of between about 0.1 mm to 1 mm. In another embodiment, the glass may be a thick, thermally-tempered glass having a thickness of about 1 mm to 3 mm.

The top protective sheet 402 may be fabricated from a number of panes to reduce stress induced by differential thermal expansion between the top protective sheet 402 and the base plate 408. The individual panes in the top protective sheet 402 may have a small gap or expansion joint between them to allow for the differential thermal expansion. This gap may be between about 0.2 to 2.0 mm. In one embodiment, the gap may be about 1.0 mm.

In another embodiment, the gap between the panes may be sealed with a barrier material such as silicon, epoxy, butyl, or any other similar material that is compliant, optically transmissive, and seals out moisture and water.

Base plate 408, encapsulant layers 404, solar cells 406, and top protective sheet 402 may each have a thickness of between about 0.01-3.0 mm to provide for a low cost and light weight solar receiver 400. For example, the top protective sheet 402 may weigh less and be thinner than traditional 4 mm thick glass top protective sheets used in one sun collectors.

Each of the plurality of PV or solar cells 406 may be connected electrically in series to form a solar cell string 410 having a cell string axis 436. The solar cell string 410 may be formed by any known means such as soldering each solar cell together via interconnect wires 414. Each solar cell 406 may have a cell size of about 78×78 mm and may be a square wafer manufactured from a monocrystalline silicon boule. Alternatively, the solar cell may be any type of known solar cell such as multi-crystalline, single-crystalline, rear contact, emitter wrap-through, LGBC (laser grooved buried contact), PERL (passivated emitter with rear laterally diffused cell), multi-junction, silicon ribbon, thin film PV cells, and the like. Although each solar cell 406 is illustrated as a square, the shape of the solar cell 406 is not intended to be limiting as any shape may be used such as a rectangle, square with one or more rounded or truncated corners, hexagon, and the like.

The plurality of solar cells may be modified such that they have a lower series resistance when electrically connected. In one embodiment, the back surface field strength of the solar cell may be increased and the top-surface conductive grid may be thickened or increased in number to reduce the series resistance in traditional non rear-contact solar cells. In another embodiment, for rear contact PV cells, the back metallization of the solar cells may be thickened.

Each solar cell 406 may be positioned with a small gap between each other to allow room for electrical connections, differential thermal expansion, and mechanical tolerances. A single solar receiver 400 may have any number of solar cells 406 to form a cell string. In one embodiment, one solar receiver 400 may have about twenty four solar cells 406 and may be electrically connected in series, parallel, or any combination. Each solar cell 406 when illuminated may generate approximately ½ volt. Thus, if all cells are connected in series the single solar receiver 400 may generate a total of 12 volts.

A junction box 428 may be coupled to the solar cell string 410 via interconnect wires 414. The junction box 428 may be positioned on the front surface, adjacent to solar cell string 410, at each end of the solar receiver 400. Placing the junction box 428 on the same side of the base plate 408 as the solar cells string 410 facilitates electrical connections between these elements and improves the manufacturability of receiver 400

FIG. 4B shows an exemplary electrical schematic of a section of the receiver 400 wiring. In this example the individual solar cells are connected electrically in series. The junction boxes are electrically connected at either end of the cell string. The junction box 428 may be electrically connected to a junction box of an adjacent solar receiver on one side of the solar receiver 400 and may be electrically connected to a second junction box located on the opposite end of the solar receiver 400. In one embodiment, the junction box 428 may have a by-pass diode as further discussed in detail below. Some junction boxes may facilitate transfer of the power produced from each of the collectors 100 to an electrical system, such as a power generation plant described below, which may provide electrical energy for any end use. The junction box 428 thus facilitates an electrical connection between the receivers, provides strain relief for the cell string wiring, and allows for the addition and use of other devices that may be necessary, such as a bypass diode and the like.

Figure 4C:
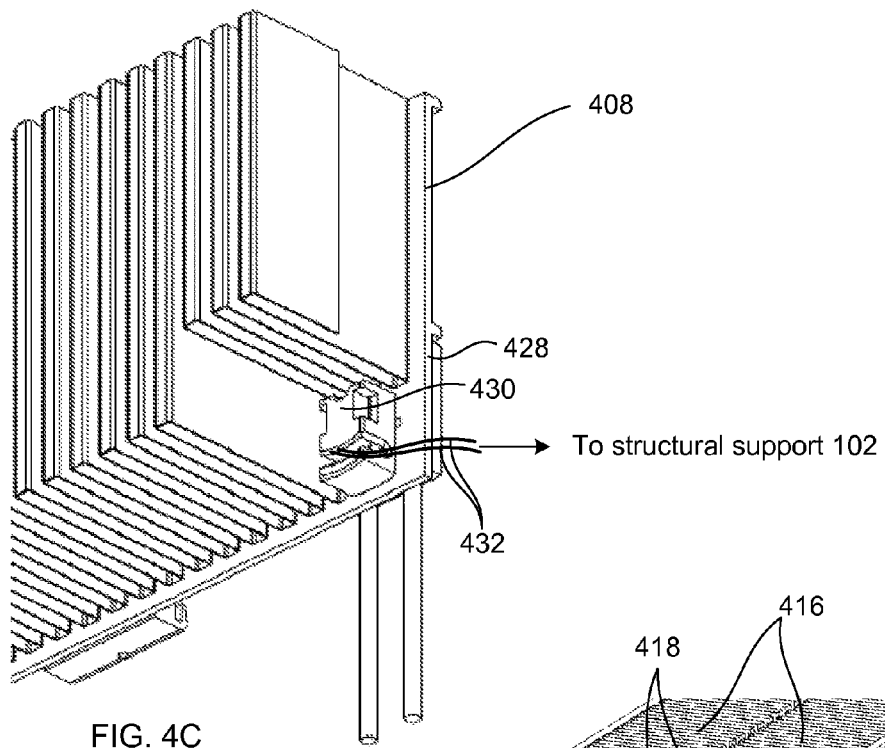

FIG. 4C illustrates a back surface of the solar receiver 400. The solar receiver 400 may have a grounding clamp 430 attached to the base plate 408 or the mating feature 412 of the solar receiver 400 behind junction box 428. The grounding clamp 430 may provide an electrical path from the base plate 408 to the structural support 102 via electrical wires 432. The wires may use 10 gauge copper wire. The structural support 102 may in turn be connected to an earth ground, thereby grounding the receiver 400 and protecting a user from any electrical short circuits that may occur. Although the grounding clamp 430 is illustrated behind junction box 428, the location is not intended to be limiting as the grounding clamp 430 may be positioned at any location on the base plate 408, such as any other location on the back surface, the front surface, top, or bottom of the base plate.

Figure 4D:
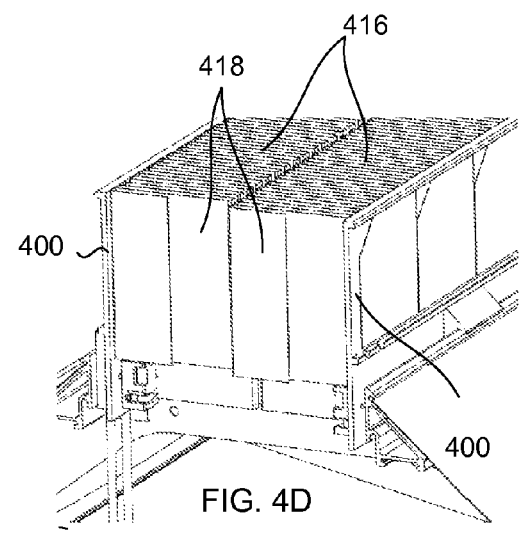
Figure 4E:
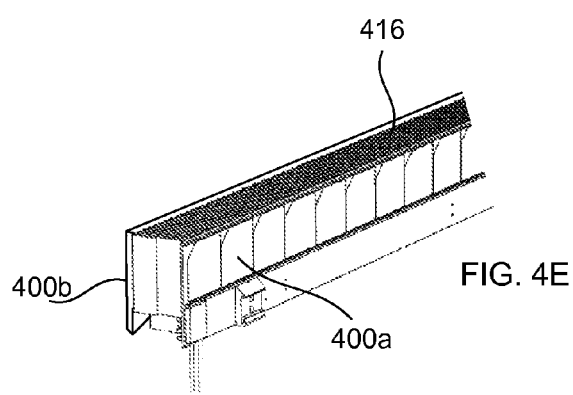

FIG. 4D illustrates an exemplary solar receiver having a heat sink 416 extending outwardly and coupled to the base plate 408 of the solar receiver 400. The heat sink 416 may have a plurality of fins 418 positioned vertically and perpendicular to the base plate 408. When the solar receiver 400 is coupled to the receiver structure 107, the plurality of fins 418 may be substantially perpendicular to the frame 108, longitudinal plane 140, trough or optical apertures 101, the longitudinal axis 162, and the bisecting plane 105. The heat sink 416 allows heat generated in the solar cells 406 to dissipate upwardly by natural free convection through the plurality of fins 418 without obstruction or interference from the solar cell string 410. This minimizes the temperature rise experienced by solar cells 406 improving efficiency and prevent warping, electrical shorts, or any other malfunction due to high temperatures. This embodiment may be used in both the outer solar receivers 104*a* and inner solar receivers 104*b* as illustrated in FIGS. 1A and 1B. Use of this embodiment as an inner solar receiver 312*a*, 312*b* is also illustrated in detail in FIG. 3A. This allows for easier manufacturing as only one solar receiver configuration needs to be manufactured for the collector 100.

FIG. 4E illustrates another exemplary solar receiver having a common heat sink 416 coupled between two solar cell strings 400*a*, 400*b*. This embodiment may be used as the inner solar receiver 300 as illustrated in detail in FIG. 3B. The heat sink 416 may be used to allow heat generated from the solar cell strings 400*a*, 400*b* to dissipate upwardly by natural free convection through the plurality of fins 418 to maximize operating efficiency and prevent warping, electrical shorts, or any other malfunction due to high temperatures. Furthermore, the heat may dissipate upwardly without any obstruction or interference from the solar cell strings 400. This embodiment allows for easier assembly as a user will only need to attach a single inner solar receiver 300 onto the reflector structure 107.

Although the illustrated solar cells are positioned on the base plate as a single linear row of cells this is not intended to be limiting. For example, two rows of solar cells may be positioned one above the other. A two row receiver would allow a control system to track the power produced by each row to determine whether the collector is correctly aligned. Should the same power be generated from each of the solar cell rows, the collector would be properly aligned. If the power generated from each of the solar cell rows are different, the collector may be rotated about the pivot axis, as further discussed below, to ensure it is properly aligned with the sun and used efficiently.

Figure 5:
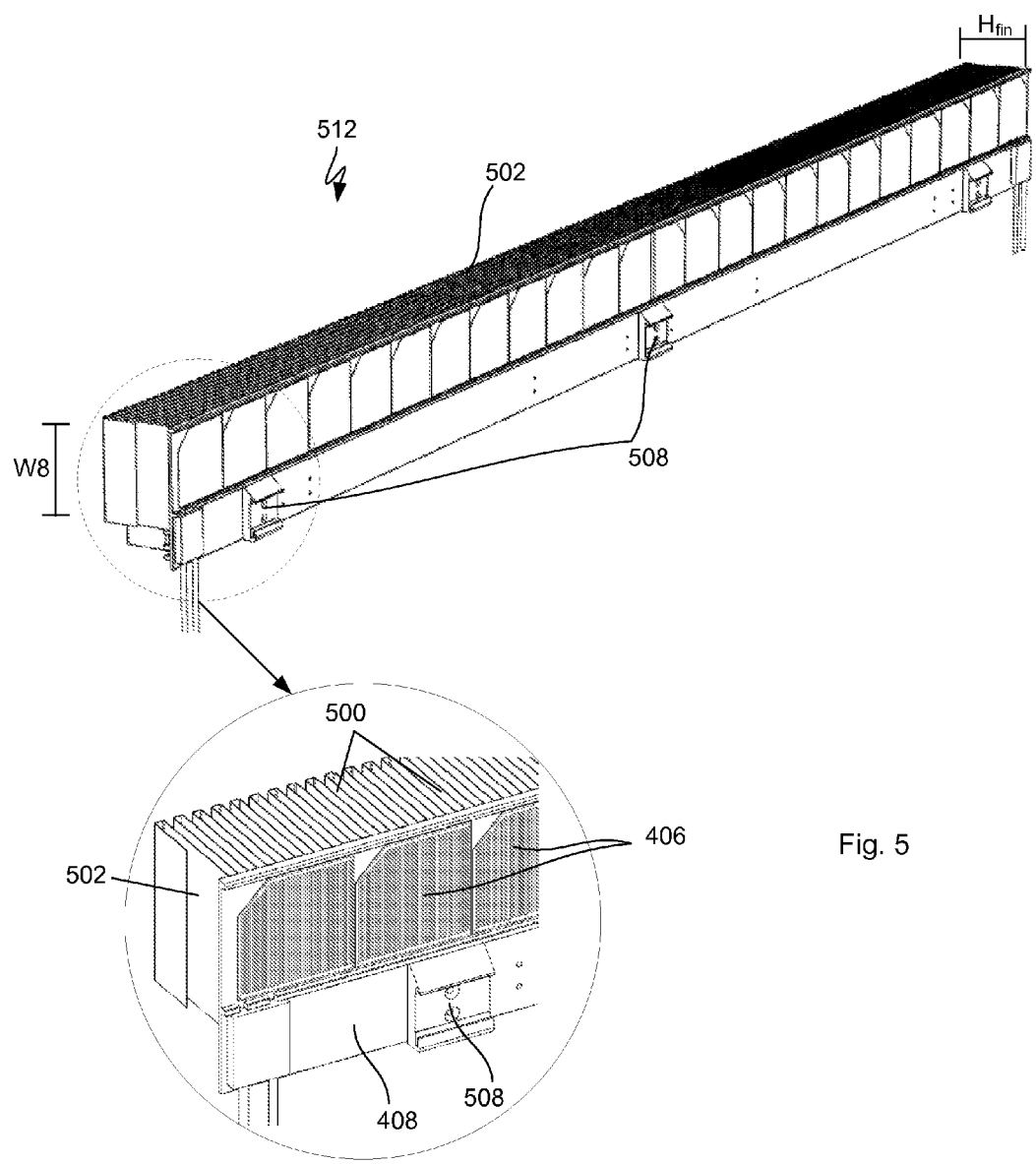
FIG. 5 illustrates an exemplary heat sink.

FIG. 5 illustrates an exemplary heat sink. The heat sink 500 is positioned on the back of the base plate 408 opposite from the cell string. The heat sink 500 has a plurality of interconnected fins 502 to form the heat sink 500. Each plurality of fins 502 may have a width (W8) that is substantially equal to the width of base plate 408 (W6+W7) or may be between about 25-150 mm. The height ($H_{fin}$) may be between about 25-150 mm.

The heat sink 500 may have a plurality of interconnected fins 502 created by forming a continuous roll of material to form a serpentine configuration. This eliminates the need to assemble a heat sink using individual fins and is low cost and easy to manufacture. Furthermore, heat sink 500 may be coupled to the base plate 408 after the solar cells 406 have been installed on the base plate 408 and the base plate/solar cell assembly laminated together as a single unit. This may obviate the need for the lamination process to accommodate the heat sink, thereby allowing use of standard lamination equipment. The heat sink 500 may be coupled to the back of the base plate 408 by any known means such as with the use of structural thermal adhesives, bolts, screws, swaging, staking, welding, soldering, brazing, and the like.

As illustrated in FIG. 5, in one embodiment, the solar receiver 512 may have clips 508 to facilitate attachment to the reflector structure 107. The clips 508 may allow the solar receiver 512 to be slid along the top rails 202, 204 or removably attached to the top rails 202, 204 by snap fit, pressure fit, or any other means. This allows a user to easily, efficiently, and quickly remove a solar receiver 512 without having to slideably remove any adjacent receivers. Additionally, use of the clips 508 may provide for good thermal insulation between the solar receiver 512 and the reflector structure 107 as there is only a small contact area between the solar receiver 512 and reflector structure 107.

Figure 6A:
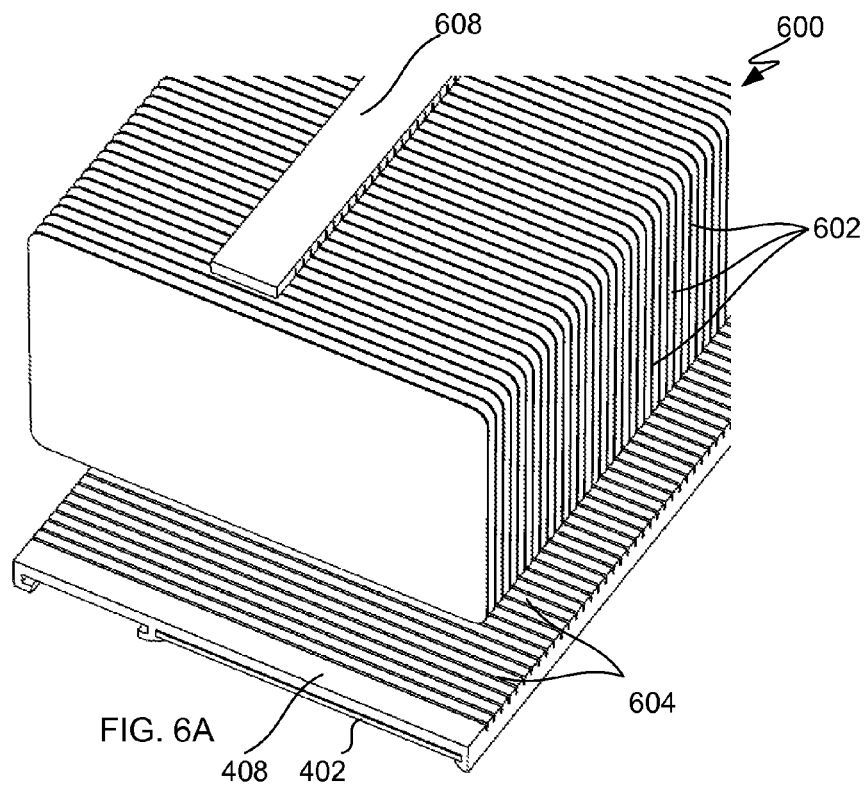
FIGS. 6A and 6B illustrate another exemplary heat sink.
Figure 6B:
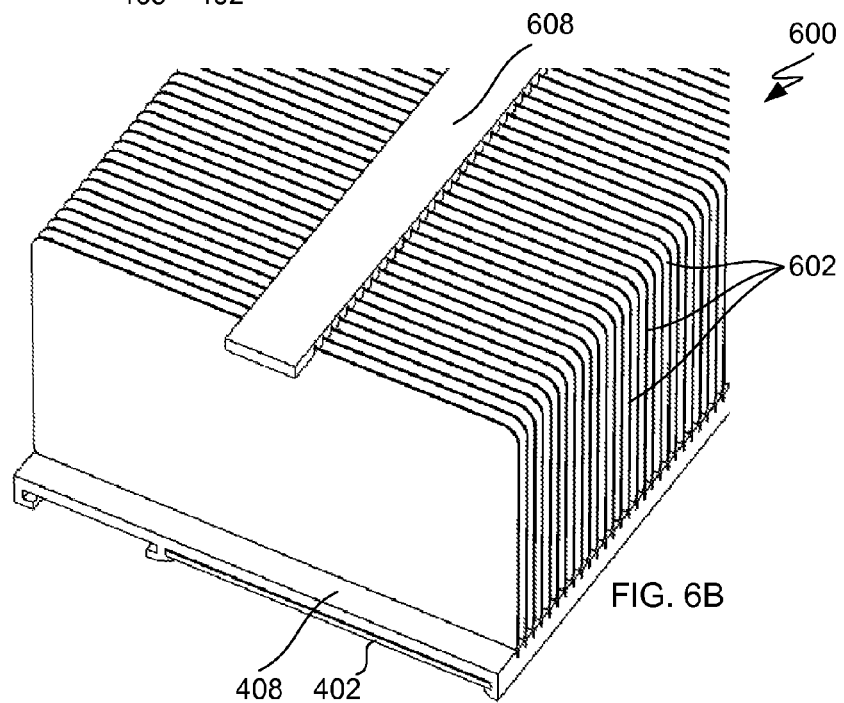

FIGS. 6A and 6B illustrate another exemplary heat sink. The heat sink 600 has a plurality of non-interconnecting, individual fins 602. The back of the base plate 408 may have a plurality of tapered grooves 604 cut into it to receive each of the plurality of individual fins 602. To assemble, in one embodiment, the heat sink 600 and the base plate 408 are press-fit together. A fin plate 608 may be used to engage the fins 602 to prevent buckling during the press-fit process. The plurality of solar cells may thus be subjected to the full pressure required for a press fit, whereby the base plate 408 provides the support necessary to support each solar cell evenly to prevent cracking of the solar cells. In another embodiment, the heat sink 600 and the base plate 408 may be coupled together by the use of structural adhesives, bolts, screws, welding, soldering, brazing, and the like.

As stated above, fin plate 608 may prevent warping of the base plate 408. During the press fit, the back surface of the base plate 408 may be put into compression from the plurality of fins 602, which may cause the base plate 408 to bow and become concave on the solar cell side. Thus, the fin plate 608 may constrain the far ends of the plurality of fins 602 and each plurality of fins 602 applies a small reaction moment along the far edge of each fin 602 which may prevent such bowing. This heat sink 600 design or configuration places the base of the fins 602 close to the solar cells to minimize the heat flow resistance between the solar cell and fins. In one embodiment, the heat sink fins 602 may be between about 1-15 mm away from the cell string.

Figure 7A:
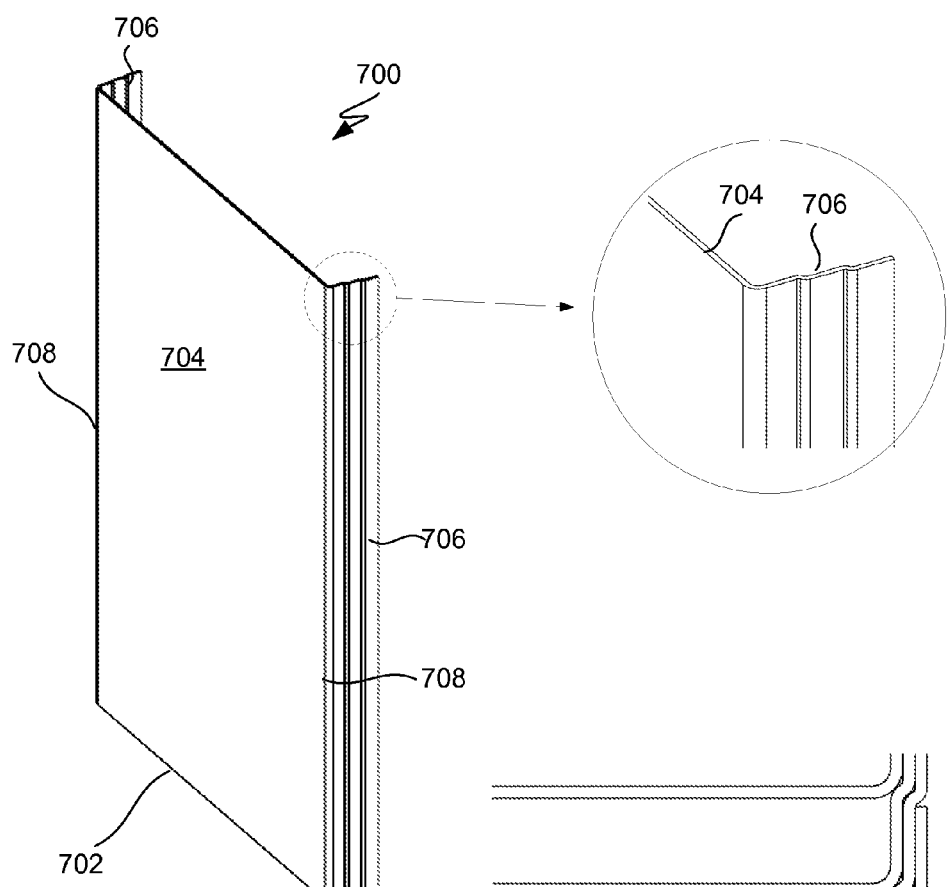
FIGS. 7A-7C illustrate yet another exemplary heat sink.
Figure 7B:
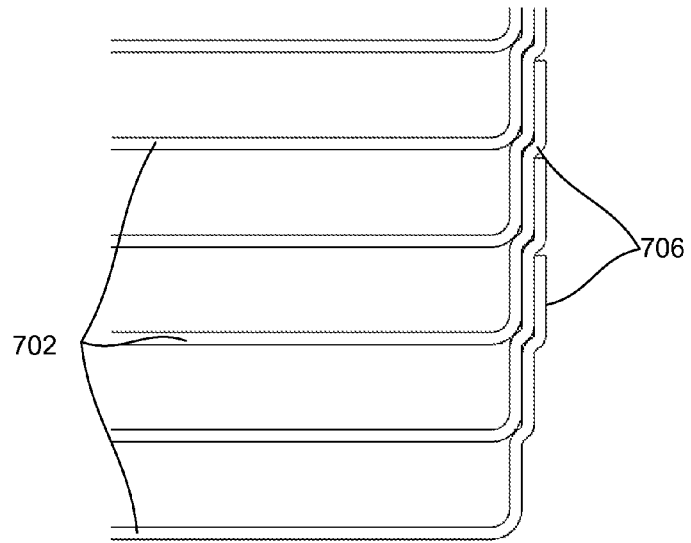
Figure 7C:
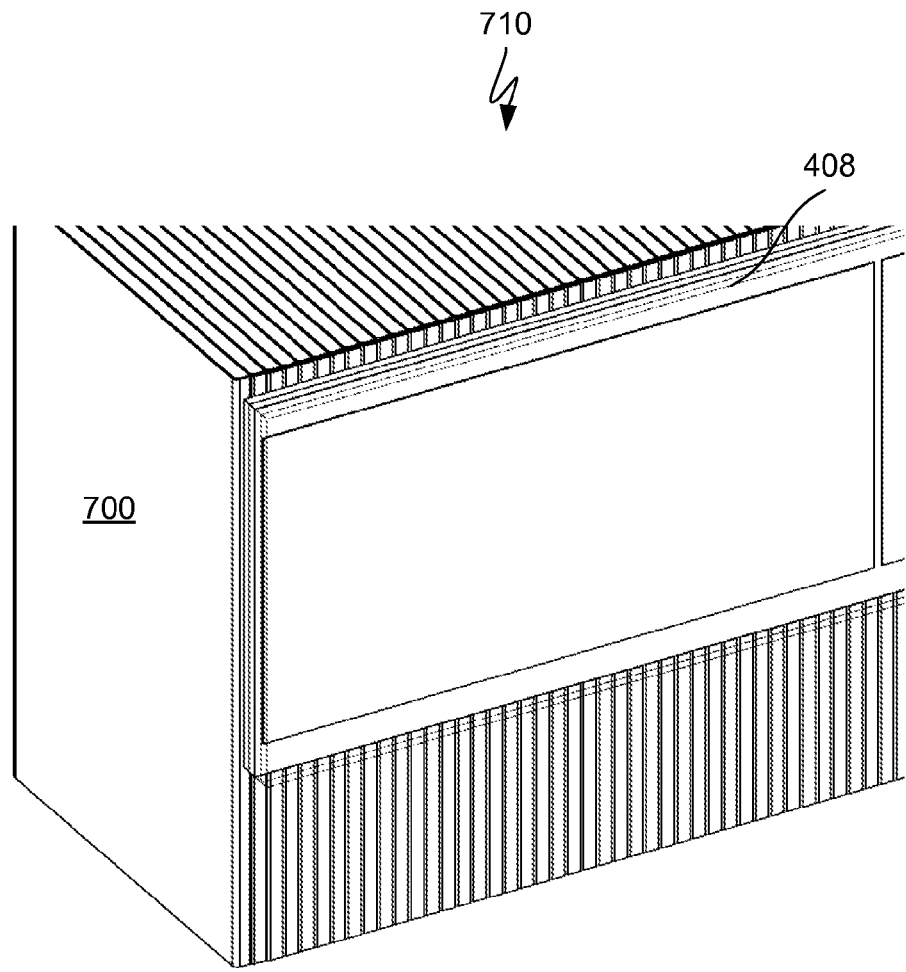

FIGS. 7A-7C illustrate yet another exemplary heat sink. FIG. 7A illustrates a perspective view of a fin 702 of the exemplary heat sink 700. The heat sink 700 may have a base 704 having step-shaped edges 706 extended outwardly from the sides 708 of the fin 702. FIG. 7B illustrates a plurality of fins 702 coupled together. The step-shaped edges 706 are configured to stack against the step-shaped edges 706 of other fins 702, yet keeping a space between them to form the heat sink 700. The fins 706 may be coupled together by any known means such as with the use of structural adhesives, bolts, screws, welded together, or the like. FIG. 7C illustrates the heat sink 700 coupled to a base plate 408. This embodiment may allow for the use of a base plate 408 that is made of a flexible foil that may be an intermediary between the cell string and the plurality of fins 706. This may reduce cost and weight of the solar receiver 710. Furthermore, the solar receiver 710 may have a lower thermal resistance since the thickness of the base plate has been decreased.

In one embodiment, the fins 602, 502 may have slits, grooves, cuts, openings, or the like (not shown) to provide an increase in heat transfer from the fins to the air as well as provide for a lighter solar receiver.

Figure 8:
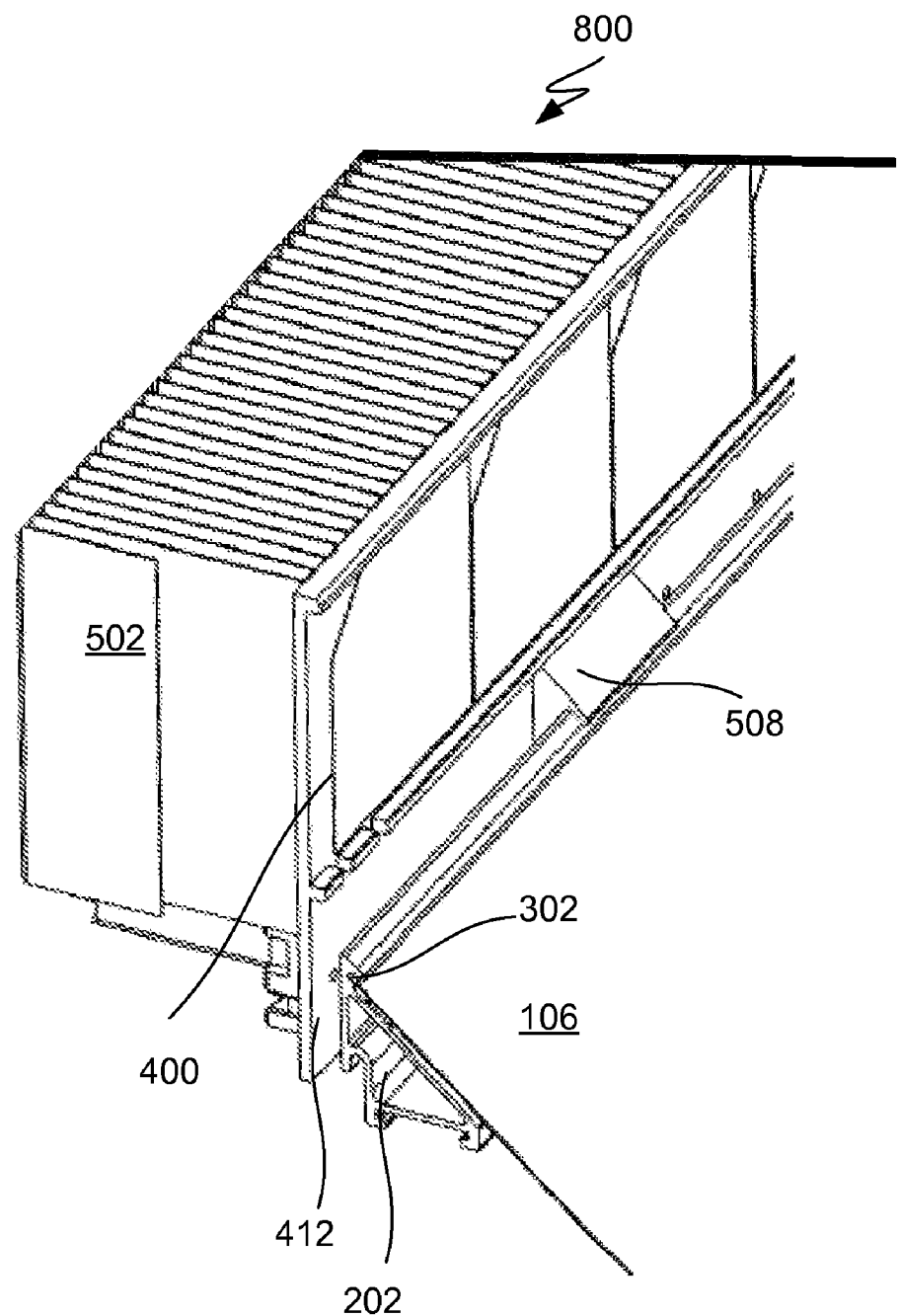
FIG. 8 illustrates an exemplary attachment of a solar receiver to a support structure.

FIG. 8 illustrates an exemplary attachment of a solar receiver 800 to a top rail 202 of the reflector structure 107. The solar receiver 800 is illustrated using the heat sink of FIG. 5A. The solar receiver 800 may be slideably coupled to the support structure 102. The mating feature 412 of the solar receiver 800 may be slid along top rail 202. Alternatively, solar receiver 800 may be coupled to top rail 202 using clips 508, screws, split-clamps, sliding detents, mechanical interfaces or some combination of these items to allow installation and removal of receiver 800 without removal of adjacent receivers. The design of receiver shown in FIG. 4E may facilitate this type of coupling. When the solar receiver 800 is aligned to the sun to begin operation, the solar receivers 400 may heat up to between 10° to 30° C. above the ambient temperature, the exact temperature rise depending on the wind and solar insolation. This temperature rise may cause the length of the solar receivers 400 to increase from thermal expansion. However, the temperature rise of the mating feature 412 and top rail 202 will be less, since they are not directly exposed to concentrated sunlight and they are in poor thermal contact with the receiver. In one embodiment, the solar receivers may be positioned next to each other with a nominal gap of between about 0.01 to 10 mm to accommodate for thermal expansion, electrical interconnections, and mechanical tolerances without any stress to each solar receivers 800.

The solar receivers 800 may be positioned such that the cell string is situated in front of the optical focus of the reflector panels 106 (FIG. 1F). This avoids extreme concentration areas of sunlight on cells that could damage the cell and deleteriously affect its performance. This may also avoid bringing the sunlight to a focus in front on the solar receiver, which may pose a safety hazard. The face of each solar cell is also perpendicular to the trough aperture and parallel to the longitudinal axis.

As discussed above, the dual trough configuration used in this invention allows for less shadow over the collector as the solar receivers may be positioned on the top sides or edges of the collector. Moreover, having the closed truss below the reflector panels eliminates shadow formation on the reflector panels. However, should there be a shadow over one or more of the solar cells or if one of the solar cell malfunction, the cells in the string become mismatched and the output of the cell string drops precipitously. If the solar cells 406 are connected in series, current through all the solar cells in a string must be the same, implying that the current from the cell string is equal to the lowest cell current.

To account for a possible cell mismatch, a bypass diode may be used. Any known bypass diode may be used to protect the solar cells from thermal destruction and maintain useful power output in case of total or partial shading, broken solar cells, or cell string failures. In one embodiment, a single bypass diode may be coupled to each individual solar receiver 104. In another embodiment, a bypass diode may be coupled to each solar cell 406 or a group of solar cells in each solar receiver 104. In yet another embodiment, a bypass diode may be coupled to a series of connected solar receivers. In use, the bypass diode may determine whether a solar cell or group of solar cells is limiting the output and divert current around the limiting solar cell or cells. In one example, if the threshold current is not met due to shadows, solar cell failure, or any other reason, the bypass diode may allow the current to flow around the cell string thereby preventing a loss of output power.

Figure 9A:
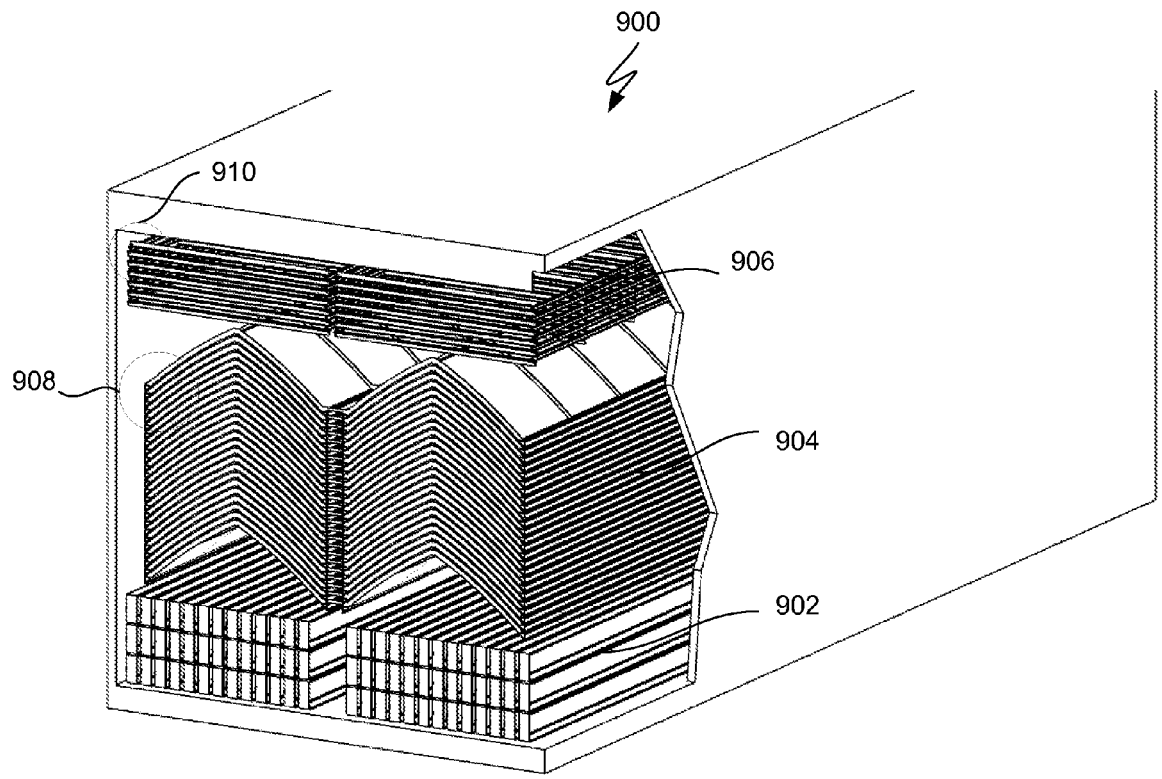
FIGS. 9A-9C illustrate an exemplary shipping container for the solar energy collectors.
Figure 9B:
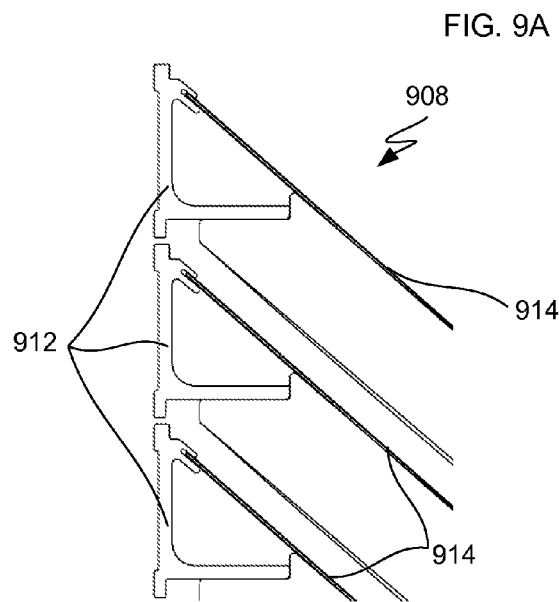
Figure 9C:
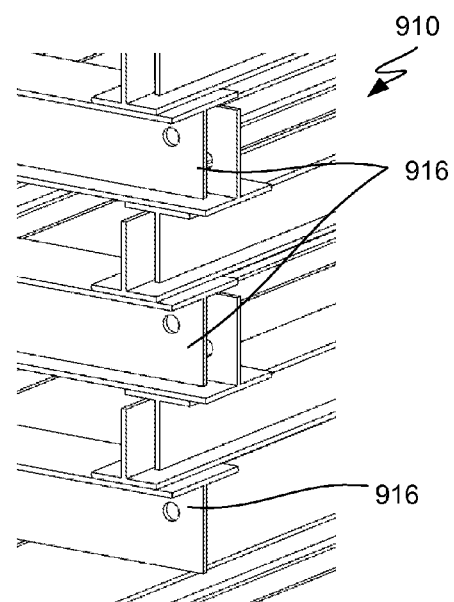

The economic viability of a solar photovoltaic system is dictated not only by the collector design, but also by the costs associated in manufacturing the various system components, with shipping the system to the operating site, installing the system, and maintaining and operating the system once it is installed. FIGS. 9A-9C illustrate an exemplary shipping container that contains a kit suitable for assembling a group of the solar energy collectors. Several standard shipping containers, such as a twenty or forty foot container may also be used. As an example, FIG. 9A illustrates a perspective view of one twenty foot equivalent unit (TEU) container packed with twenty-five collectors. Internal dimensions of a TEU may be about 5.8×2.3×2.3 m with a volume of about 33 m$^3$. The maximum payload may be about 21,710 kilograms (kg). The solar receivers 902, reflector structure 904, and frames 906 are packaged and shipped separately in the TEU container and assembled on site. Site attachment of these components allows efficient shipment to the installation site, since the components can be nested together within a standard shipping container. FIG. 9B illustrates a detailed view of 908 of FIG. 9A. FIG. 9B illustrates that when the reflector structures 904 are stacked together, the rails 912 bear the weight of the stack during shipment and helps prevent scratches on the reflectors 914. FIG. 9C illustrates a detailed view of 910 of FIG. 9A. FIG. 9C illustrates an exemplary configuration to stack the frames 906. The cross sections or T-sections 916 of the frames 906 enables the frames 906 to be nested during shipping by flipping and staggering every other frame 906.

An alternative to shipping the various collector parts within a single container is to ship different collector parts in different containers. As in the previous example, standard shipping containers, such as TEU containers, may be used. This shipping method facilitates a manufacturing production system where different collector components can be manufactured at different locations then shipped to the installation site. For example, the receivers 902 require a relatively sophisticated manufacturing process and their production could be located in an area with a skilled workforce. The reflector structure 904 and frames 906 require less sophisticated manufacturing techniques and their production may advantageously be located in an area with lower labor costs, close to the panel manufacturing location, and/or close to the installation sites. Using this alternative manufacturing and shipping system may allow minimization of the entire solar photovoltaic system cost.

FIGS. 10A-10D illustrate an exemplary power generation plant in accordance with an embodiment of the invention that utilizes an array of solar energy collectors. The dual-trough design allows the structure of the collectors to be supported at a pivotal axis 1002 located in between the two troughs 1014a, 1014b. The pivotal axis 1002 may be located in the bisecting plane 105 (FIG. 1C) at or near the collector 100 center of gravity. The center of gravity may also be located in the bisecting plane 105 slightly below the longitudinal plane 140 (FIG. 1C). The exact location of the center of gravity depends on the weights of the receivers 902, reflector structure 904, and frame 906. This is different from single-trough designs in which the pivot must be placed either in front of or behind the reflector. The single trough is either cantilevered from a pivot behind the reflector, or supported with a pivot at the center of gravity, which is located in front of the reflector. In cantilevered single-trough designs, either large torques must be transmitted from the tracking actuator along the structure of the trough or expensive and cumbersome counterweights must be used. When supported with a pivot at the center of gravity, the posts must extend above the reflector requiring regular gaps in the reflector to accommodate the posts. Both the post section protruding beyond the reflector plane and the gaps in the reflector itself will cast shadows on the cells. The dual trough configuration eliminates this problem by placing the pivot axis both behind the reflector and very near the center of gravity of the collector. Nominally, the collector 1000 may rotate through 120 degrees with the pivot within 10 centimeters (cm) of the center of gravity. However, the collector 1000 may also rotate through larger angles with the pivot farther than 10 cm away from the center of gravity.

The designer of a particular dual-trough system may make a small trade-off between range of motion and torque. To increase the range of rotation, the pivot may be moved back, away from the center of gravity and longitudinal plane 140, at the cost of increased holding torque. Conversely, by placing the pivot at the center of gravity, a design with zero holding torque and slightly decreased range of motion is possible. Moving the pivot permits optimization of the collector for the particular installation. For example, in a ground installation where land is cheap, the increased structure spacing and increased range of motion may permit operation for a longer fraction of the day at the cost of a marginally stiffer structure and tracker. However, for a rooftop installation where rows might be spaced more tightly a balanced configuration may be used to minimize structure and tracking weight.

The dual trough configuration brings both the center of gravity and the pivot axis 1002 close to the apertures 101 of the solar receiver. The center of gravity may pass through or be located near the pivot axis 1002 and the bisecting plane 105 (FIG. 1C). When stowed in a low-drag configuration with the aperture horizontal, this allows the overall structure to be lower than a traditional full parabolic trough of the same aperture. The lower height may result in lower bending moments in the collector support post 1018 from wind loads.

The collectors or modules 1000 may be installed in rows as long as allowable to minimize end losses. Furthermore, the solar receivers need not be coupled to the entire length of the collector. For example, on the side away from the incident sunlight, sunlight is reflected out of the end of the trough and not captured on a solar receiver. Likewise, on the side facing the incident sunlight, some light which does not pass through the aperture may be received by the receiver. On the side facing the incident sunlight, the first receiver closest to the incident sunlight may receive no or only partial sun. As such, the first receiver may be omitted in this collector.

Figure 10A:
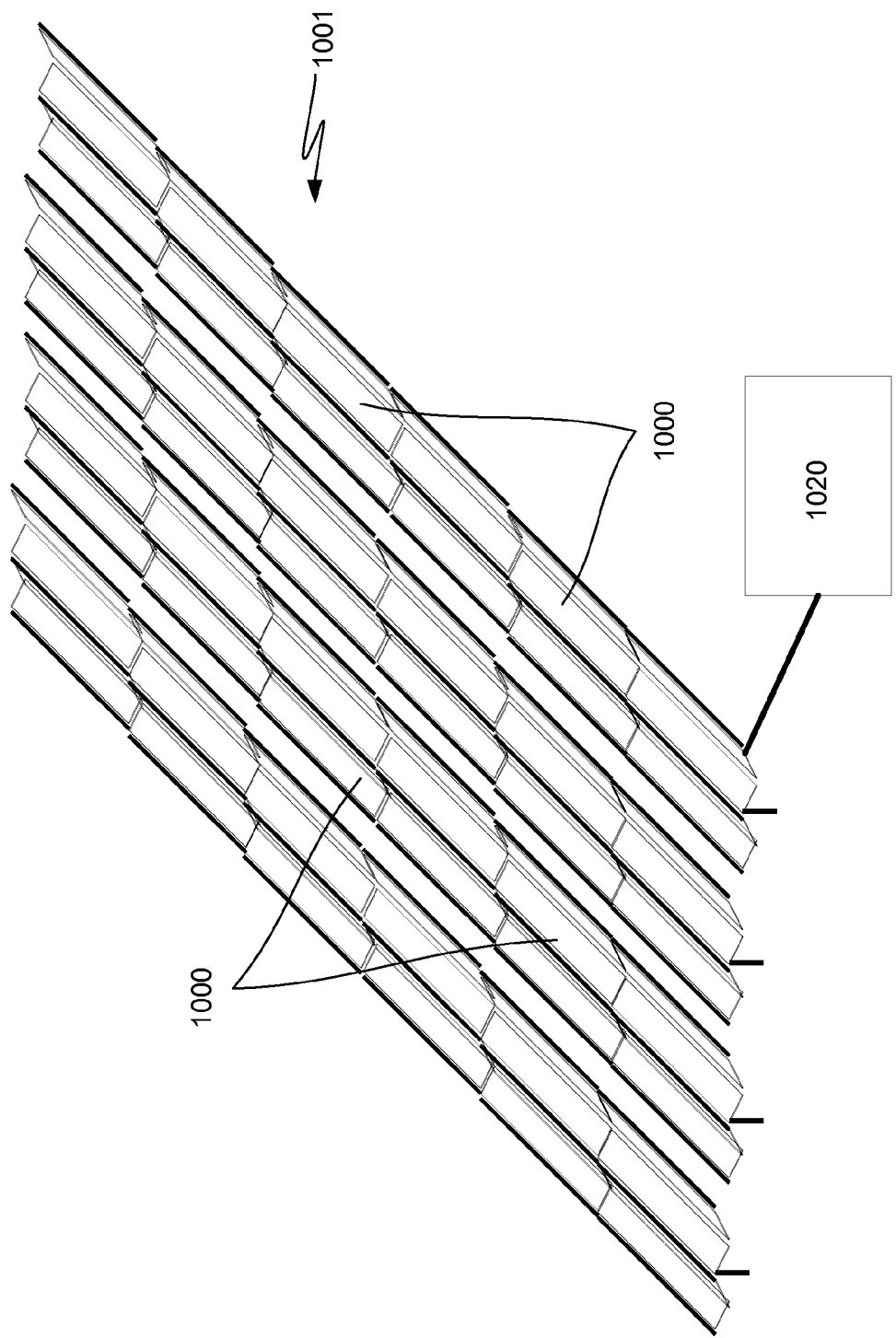
FIGS. 10A-10D illustrate an exemplary power generation plant in accordance with an embodiment of the invention that utilizes an array of solar energy collectors.

Module rows may be spaced approximately 2.4 times the collector width to reduce shading from adjacent rows. FIG. 10A illustrates a perspective top view of an exemplary power generation plant 1001 that utilizes an array of solar energy collectors placed in a plurality of rows. In this example, the collector field consists of 4 rows of collectors 1000 with each row containing 6 collectors 1000. The rows are spaced apart to avoid shadowing of the adjacent collectors as the collectors tracks the sun throughout the day. A single tracker mechanism can drive each collector in a row and/or multiple rows. Within any row the collectors have a minimal gap between, on the order of several mm or less, minimizing shadowing of the receivers. No mechanical features obstruct sunlight to any collectors in the field. The energy collected from all the collectors 1000 may be transmitted through the junction boxes 428 (FIG. 4A) and transmitted to any known electrical system 1020 to provide electrical energy for any end use.

Figure 10B:
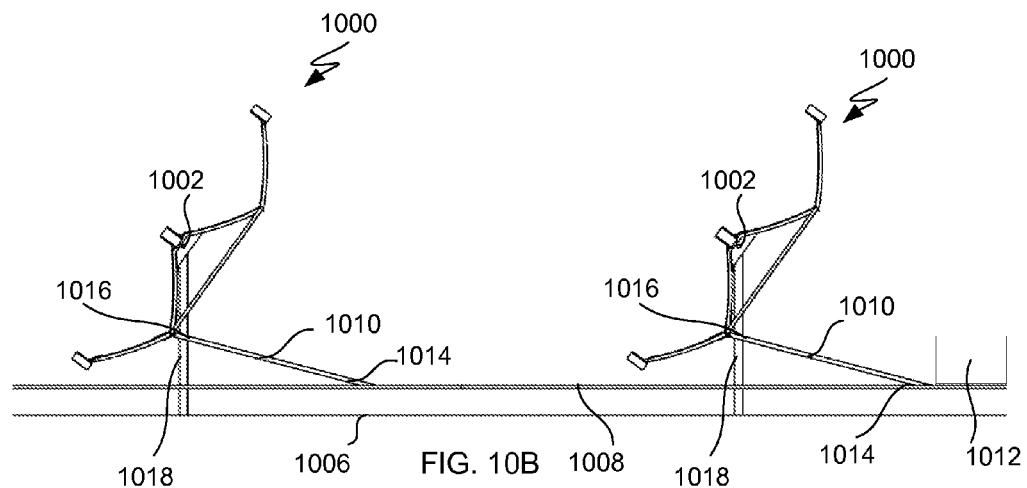
Figure 10C:
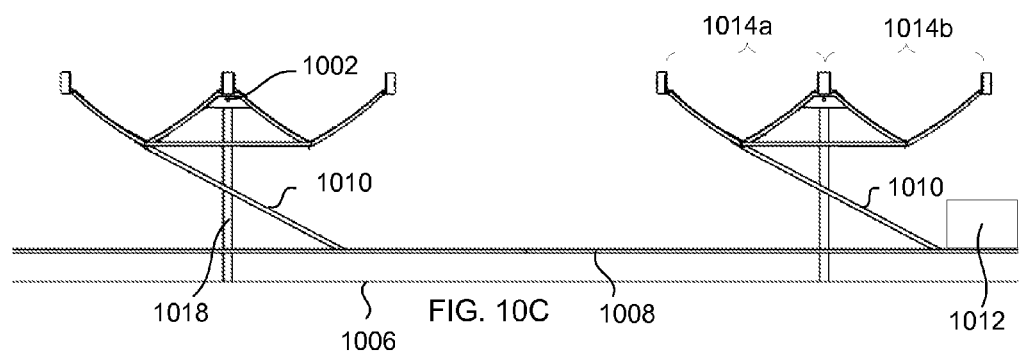
Figure 10D:
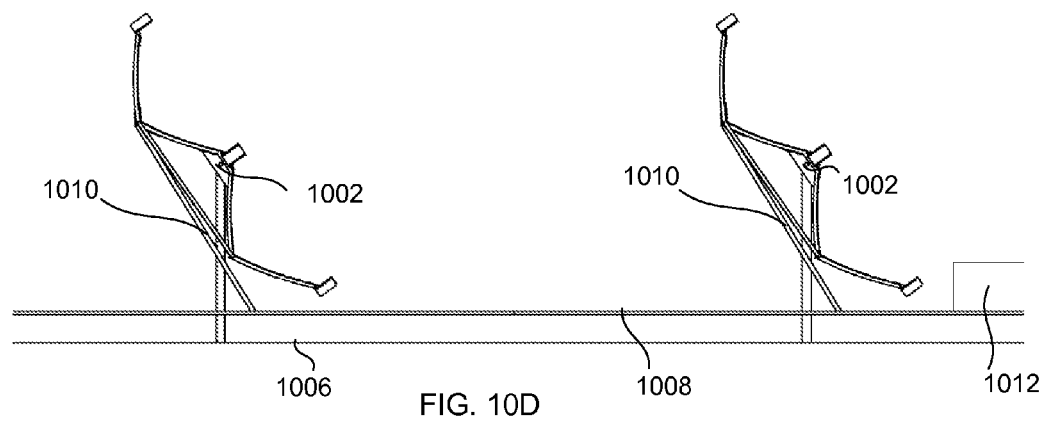

FIGS. 10B through 10D illustrate two rows of modules rotating about the pivot 1002 to remain oriented to the sun during the day. A tracker mechanism may have a fixed track 1006, sliding link or track 1008, and a transfer link 1010. The fixed track 1006 may be oriented perpendicular to the collector rows and located below the plane of the collector 1000 at the extent of rotation of the collector 1000. The fixed track 1006 may provide a guide for the sliding track 1008, which may be actuated at one end by an actuator 1012. The sliding track 1008 may be coupled to each transfer link 1010 by a pivot at a first end 1014. The far or second end 1016 of each transfer link 1010 may connect to the module 1000 near the valley or bottom 1016 of one trough 1000 as illustrated. This linkage arrangement allows a single actuator 1012 to control multiple rows of collectors and to achieve the desired range of motion throughout the day without losing too much leverage. FIG. 10C illustrates an exemplary configuration in which the tracker linkage 1010 has the most leverage over the module 1000 while FIG. 10D illustrates an exemplary configuration in which the tracker linkage 1010 has the least leverage. The difference in torque of the transfer link 1010 about the pivot axis 1002 between the positions illustrated in FIG. 10B and FIG. 10C is less than a ratio of 2 to 1 for a 120° range of motion. In an alternative embodiment, the tracker mechanism may allow a range of motion between 90° to 160°. In one embodiment the range of motion may be 140°. Aside from tracking the sun during periods of clear weather, the tracker mechanism is also used to orient the collector horizontally during adverse weather, for example a rain storm with strong winds. This orientation allows easy draining of water through drainage gap 110 and minimizes the wind load on the collector 1000.

The collector design facilitates installation at various types of installation sites. For example, a field of collectors could be installed on the ground. Alternatively, a field could be installed on a roof top, particularly on a flat roof of a commercial building. Installation begins with rows of posts 1018 that have been installed at a spacing approximately equal to the collector length. Posts are located at the junction between two collectors. Collectively the plurality of posts form a stand, which supports the collectors and allows them to be rotated about the pivot axis. The gap between longitudinally adjacent collectors 1000 may be nominal, for example between 0.5 and 10 mm. Minimization of the gap between longitudinally adjacent collectors 1000 ensures a minimal shadow on the receivers. Alternatively, the collector reflector surfaces may slidingly overlap each other to eliminate any shadow. Unlike current concentrating solar PV modules, collectors 1000 have no mounting hardware or support structure extending above the reflector panels.

In one embodiment to assemble the solar energy collector system, the reflector structure 107 may weight less than 240 lbs. and may be bolted to the posts 1018 at the tracker pivot 1002. The frame is then attached to the reflector structure. Alternatively, the frame may be attached to the reflector structure prior to the mounting of the reflector structure to the posts. Next, the twelve solar receivers are slid into place along each of the receiver support rails—three solar receivers on each rail. The solar receivers are connected electrically in series by a single plug that contains two terminals for the string circuit and one for the structure ground. After a collector is populated with receivers, the next adjacent collector is installed and coupled to other adjacent collectors using any known coupling structures. The coupling structure may use a flexure to accommodate the longitudinal motion due to thermal expansion while preserving high stiffness in all other directions. This coupling process of all the collectors is continued until the desired number of receivers has been assembled and the appropriate electrical connections between collectors made. The row length is determined by the maximum allowable twist and will depend on site layout, maximum design wind speed, and the tracker actuator used.

Once installed, each row will rotate throughout the day to track the sun. Tracking will orient the face of each solar cell so its surface normal is nominally perpendicular to the incident light entering the aperture of the collector. In other words, the solar cells are oriented so that essentially no incident sunlight directly strikes the solar cells, but the solar cells receive sunlight reflected off the reflector panels 106. The collectors 1000 may be oriented in any direction although most sites may utilize a North-South orientation. If the longitudinal axis is oriented North-South, then the troughs may partially shade adjacent troughs during summer early morning and late afternoon, effectively reducing the field size by one-half. During these times, the bypass diodes on the shaded receivers will allow those receivers that are not shaded to continue to produce electricity. The heat sink performance will change depending on the angle of rotation of the module. For example, near mid-day when the sun is brightest, the plurality of air channels formed by the fins will be oriented nearly vertical and the heat sink will operate with minimal thermal resistance, since the natural convective air flow through the heat sink air channels is not obstructed by any photovoltaic cells or any other devices, elements, or features of the collector. Although the performance varies throughout the day, the cell temperature will remain relatively constant. This is in contrast to current solar PV collector systems in which the fins are oriented in the least efficient direction at mid-day and the most efficient in the morning and afternoon.

The solar receivers may require servicing, repairs, or the user may want to upgrade the solar receivers to receivers using higher efficiency solar cells. The modular design of the solar receivers allows for the ease of replacement, repair, maintenance, and servicing of the solar receivers. After a cell string has been electrically disconnected, a single receiver may be uncoupled from the adjacent receiver(s) and slid out. When a new receiver is installed, the solar receiver may easily be re-attached to the adjacent solar receivers. Thus, the modular design of the collector 1000 allows for a lower cost and ease of maintenance, repair, replacement, or servicing of the collector. Furthermore, there may be less maintenance required over a longer period of time compared to current solar collector systems.

Example

The following example is for exemplary purposes only and is not intended to be limiting as any number of solar cells may be used, the length of the solar energy collector may vary, and other embodiments may be possible.

Referring back to FIG. 1A, the solar collector may have a length $L_{collector}$ of about 5.7 m to allow for at least three solar receivers 104 to be positioned on the top sides 202, 204 (FIG. 2A) of the support structure 102. The solar receiver as discussed above with reference FIG. 4D may be used, which would allow for a total of twelve solar receivers. Each solar receiver 104 may have about twenty four solar cells electrically connected in series. Since each solar cell may generate about ½ volt, each solar receiver 104 may generate about 12 volts. Each receiver contains twenty-four solar cells so the total number of cells in the collector 100 is 288.

The total optical aperture of the collector is the width of each trough (W1) multiplied by the trough length yielding an area of approximately 11.4 m². Assuming a solar insolation of 1 kW/m² and a 17.5% collector efficiency the collector will generate approximately 2 kW of electrical power. To obtain this output power, standard silicon solar cells producing approximately ½ volt each will each generate slightly less than 14 amps of current.

In this design the optical concentration is a factor of approximately 20:1, while the geometric concentration is a factor of approximately 6.5:1. The approximately factor of three difference between the two values stems from increasing the solar cell size by approximately a factor of three to accommodate tracker misalignment and mechanical errors or deformation in the collector 100. This design requires only a modest tracking accuracy of +/−1.7° to achieve an optical efficiency within +/−10% of its maximum value. Such tracking accuracy is readily achievable by standard methods.

While embodiments and applications of this invention have been shown and described, it would be apparent to those skilled in the art having the benefit of this disclosure that many more modifications than mentioned above are possible without departing from the inventive concepts herein. For example, an actively cooled heat sink using flowing water, fluid, or air can be used in place of the passively cooled air heat sink previously described. The energy contained in the flowing fluid may be used as a source of thermal energy. Alternatively, a heat pipe could be incorporated as part of the heat sink. While a dual trough collector has been described many of the advantages of the edge collecting quarter parabolic reflector can be achieved with a single trough collector or a multiple trough collector, such as three, four, or even more troughs. Furthermore, although the receiver is described and illustrated with the use of PV cells, other receivers are contemplated and may be used, such as the use of fluids, hybrid PV and thermal systems, biocollection (algae slurry and the like) systems, other chemical and biological energy systems, and the like.

What is claimed is:

1. A photovoltaic solar energy collector suitable for use in a solar energy collection system that tracks movements of the sun along at least one axis, the collector having an aperture and comprising:

at least one reflector panel defining a reflector trough having a longitudinal axis and the aperture, there being a longitudinal plane that is substantially coplanar with the aperture; and at least one solar receiver, each solar receiver including a plurality of photovoltaic cells having active cell faces that are oriented substantially perpendicular to said longitudinal plane, wherein each solar receiver is positioned adjacent to a top edge of the reflector trough.

2. A photovoltaic solar energy collector as recited in claim 1, wherein each reflector panel is arranged to direct incident sunlight to the photovoltaic cells using a single reflection.

3. A photovoltaic solar energy collector as recited in claim 1, further comprising a support structure that supports a plurality of the reflector panels, wherein the support structure supports the reflector panels in a manner that defines the reflector trough, the reflector trough having the longitudinal axis, a trough base, a pair of reflective side walls and a trough aperture suitable for receiving incident sunlight during operation of the solar energy collection system.

4. A solar energy collector as recited in claim 3, wherein the at least one solar receiver is positioned outside the trough aperture such that the at least one solar receiver does not shade any of the reflective side walls during operation.

5. A solar energy collector as recited in claim 3, wherein the support structure supports a plurality of the reflector panels in a manner that defines a pair of adjacent reflector troughs.

6. A photovoltaic solar energy collector as recited in claim 3, wherein each solar receiver is positioned generally above an associated reflective side wall and arranged to receive solar radiation reflected from an opposing reflective side wall.

7. A photovoltaic solar energy collector as recited in claim 3, wherein each reflector side wall has a curvature that resembles a segment of a parabola and is arranged to direct incident sunlight to a receiver positioned over an opposing side wall using a single reflection.

8. A photovoltaic solar energy collector as recited in claim 1, wherein each solar receiver includes:

a base plate that carries at least one of the photovoltaic cells on a front surface of the base plate; and a plurality of spaced apart heat transfer fins carried on a back surface of the base plate, wherein the fins extends outwardly from the base plate to define a plurality of air flow channels that extend substantially perpendicular to the trough aperture and substantially perpendicular to the longitudinal axis.

9. A photovoltaic solar energy collector as recited in claim 3, wherein: the trough aperture has an aperture axis that is substantially perpendicular to the longitudinal axis; and the at least one solar receiver is a plurality of solar receivers, each solar receiver being positioned generally adjacent and above an associated side wall such that the solar receivers do not shade the reflective side walls during operation in a mode the tracks movement of the sun along one axis, each solar receiver including,
a base plate, and
at least one photovoltaic cell carried on a front surface of the base plate.

10. A photovoltaic solar energy collector as recited in claim 9, wherein each of the plurality of solar receivers further comprises a plurality of spaced apart fins extending outwardly from the base plate, and wherein the fins define a plurality of air flow channels to receive an air flow, the plurality of air flow channels extend substantially vertically when the trough aperture faces upward, and wherein the air flow is not obstructed by the plurality of photovoltaic cells.

11. A photovoltaic solar energy collector as recited in claim 10, wherein the fins have a serpentine configuration.

12. A photovoltaic solar energy collector as recited in claim 11, wherein for each receiver, a multiplicity of the receiver's fins are formed from a continuous metal sheet.

13. A photovoltaic solar energy collector as recited in claim 9, wherein each receiver further includes an optically transparent encapsulant layer that covers the photovoltaic cells associated with the receiver and a transparent protective sheet that covers the encapsulant layer.

14. A photovoltaic solar energy collector as recited in claim 9, further comprising a plurality of receiver support rails, each receiver support rail being coupled to the support structure and positioned generally adjacent an edge of an associated trough, wherein each receiver support rail slidably supports at least one associated solar receiver.

15. A photovoltaic solar energy collector as recited in claim 14, wherein each receiver support rail slidably receives a plurality of solar receivers to support the receiver in a manner such that the receivers are thereby mechanically decoupled along the receiver support rails in a longitudinal direction.

16. A photovoltaic solar energy collector as recited in claim 9, further comprising an insulating layer directly applied to the base plate and positioned between the base plate and the photovoltaic cells.

17. A photovoltaic solar energy collector as recited in claim 1, wherein the active faces of the photovoltaic cells are oriented substantially in parallel with the longitudinal axis of the reflector trough.

* * * * *